(12) United States Patent
Nakajima et al.

(10) Patent No.: US 11,462,562 B2
(45) Date of Patent: Oct. 4, 2022

(54) SEMICONDUCTOR DEVICE

(71) Applicant: Kioxia Corporation, Tokyo (JP)

(72) Inventors: Yumi Nakajima, Yokkaichi (JP); Satoshi Nagashima, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 206 days.

(21) Appl. No.: 17/010,451

(22) Filed: Sep. 2, 2020

(65) Prior Publication Data
US 2021/0091112 A1   Mar. 25, 2021

(30) Foreign Application Priority Data

Sep. 20, 2019   (JP) .............................. JP2019-172099

(51) Int. Cl.
| | |
|---|---|
| *H01L 27/11582* | (2017.01) |
| *H01L 27/11519* | (2017.01) |
| *H01L 27/11524* | (2017.01) |
| *H01L 27/11565* | (2017.01) |
| *H01L 27/1157* | (2017.01) |
| *H01L 23/544* | (2006.01) |
| *H01L 27/11556* | (2017.01) |

(52) U.S. Cl.
CPC ...... *H01L 27/11582* (2013.01); *H01L 23/544* (2013.01); *H01L 27/1157* (2013.01); *H01L 27/11519* (2013.01); *H01L 27/11524* (2013.01); *H01L 27/11556* (2013.01); *H01L 27/11565* (2013.01); *H01L 2223/54426* (2013.01)

(58) Field of Classification Search
CPC ......... H01L 23/544; H01L 2223/54426; H01L 27/11273–1128; H01L 27/115414; H01L 27/11551–11556; H01L 27/11578–11582; H01L 27/11597; H01L 27/2481–249; B81C 99/007
See application file for complete search history.

(56) References Cited

U.S. PATENT DOCUMENTS

| | | |
|---|---|---|
| 8,250,437 B2 | 8/2012 | Sakurada et al. |
| 8,373,288 B2 | 2/2013 | Nakajima |
| 8,581,424 B2 | 11/2013 | Hirai et al. |
| 10,115,680 B2 | 10/2018 | Kusakabe |
| 2015/0279727 A1 | 10/2015 | Nakajima |

FOREIGN PATENT DOCUMENTS

| | | |
|---|---|---|
| JP | 5337234 B2 | 11/2013 |
| JP | 2015-198135 A | 11/2015 |

*Primary Examiner* — Amar Movva
(74) *Attorney, Agent, or Firm* — Oblon, McClelland, Maier & Neustadt, L.L.P.

(57) ABSTRACT

According to one embodiment, a semiconductor device comprising: a first stacked structure in which first insulating layers and first conductive layers are alternately stacked; a second stacked structure in which second insulating layers and second conductive layers are alternately stacked; a first memory pillar provided in the first stacked structure; a first dividing structure dividing the first conductive layers; a second memory pillar provided within the second stacked structure and connected to the first memory pillar; a second dividing structure dividing the second conductive layers; a first alignment mark pillar provided in the first stacked structure and projecting from the first stacked structure; a second alignment mark pillar provided on the first alignment mark pillar; an alignment mark surrounded by the second alignment mark pillar.

19 Claims, 26 Drawing Sheets

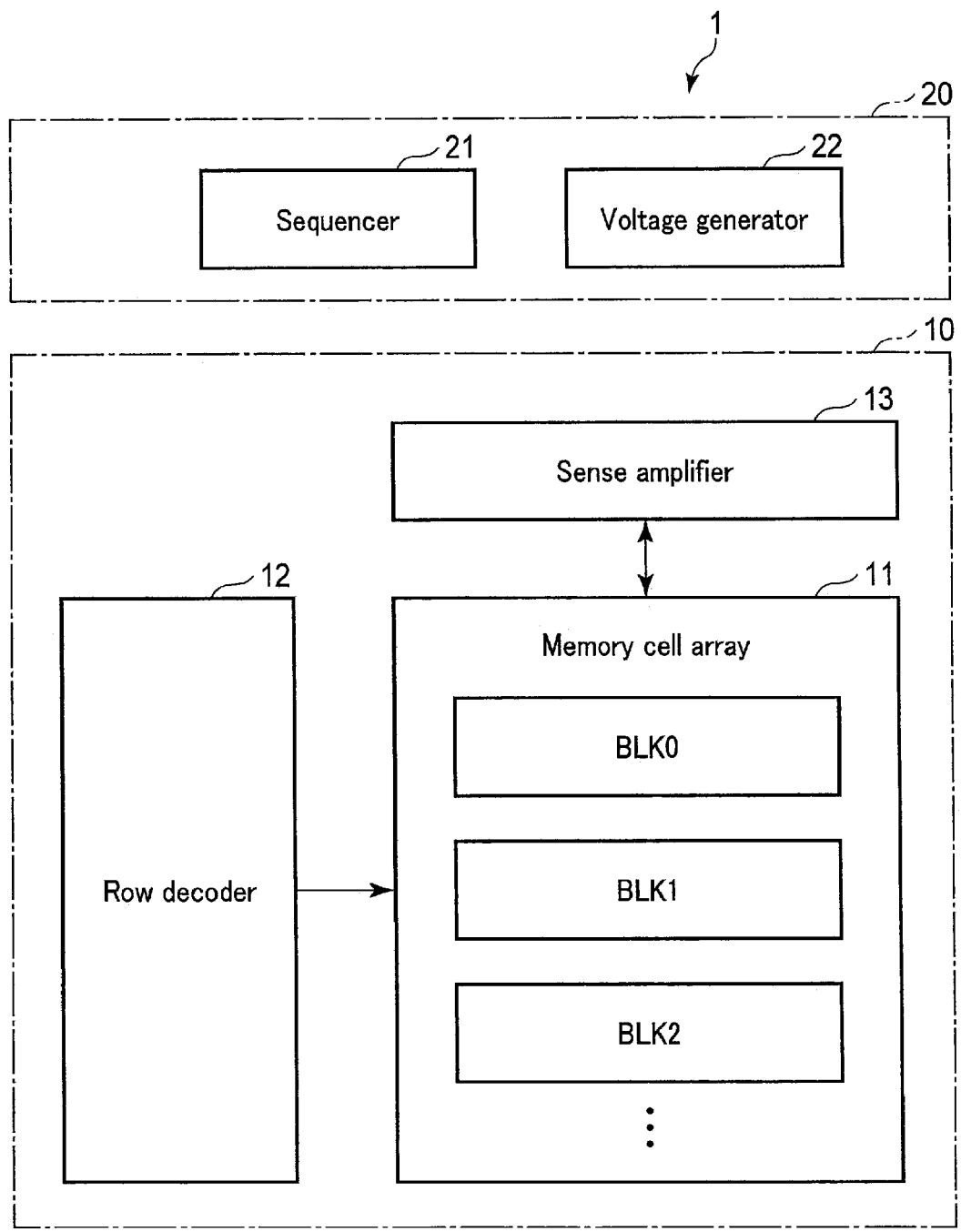
F I G. 1

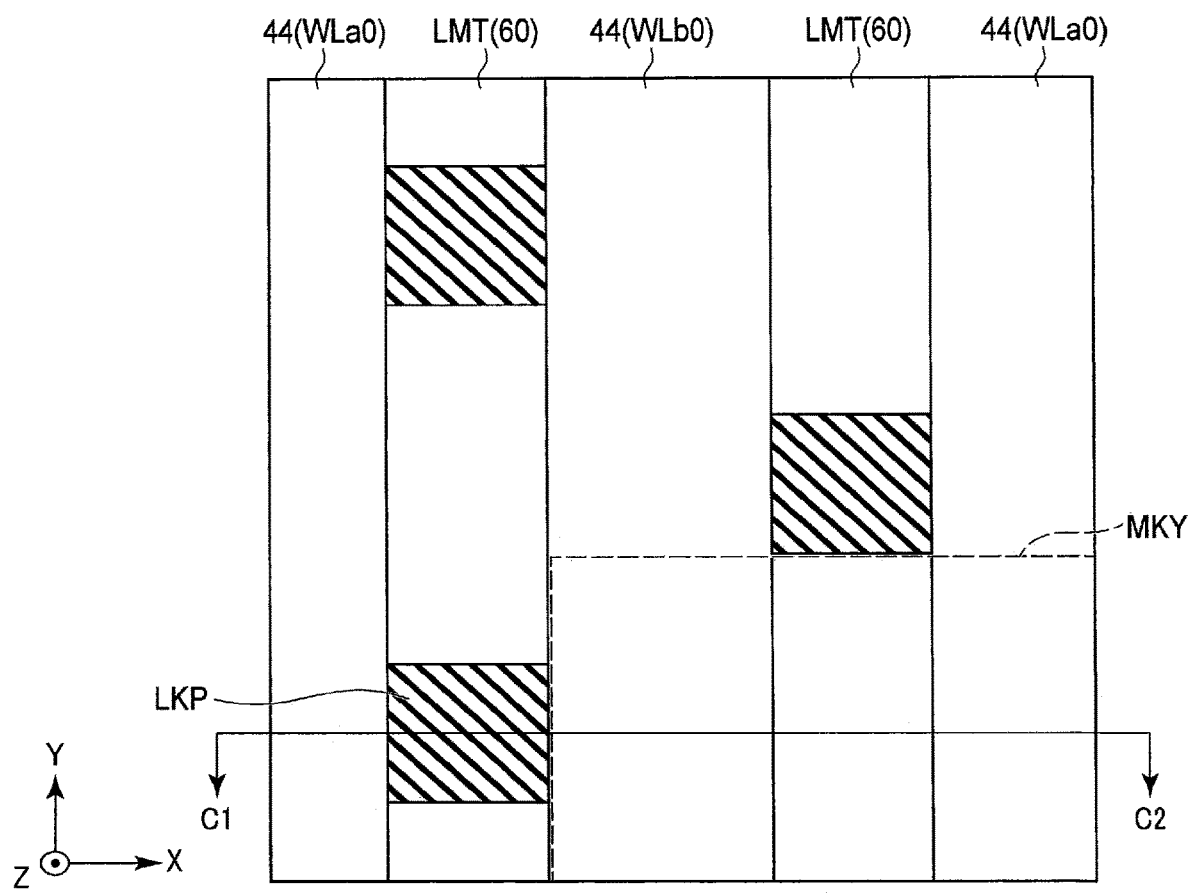
F I G. 8

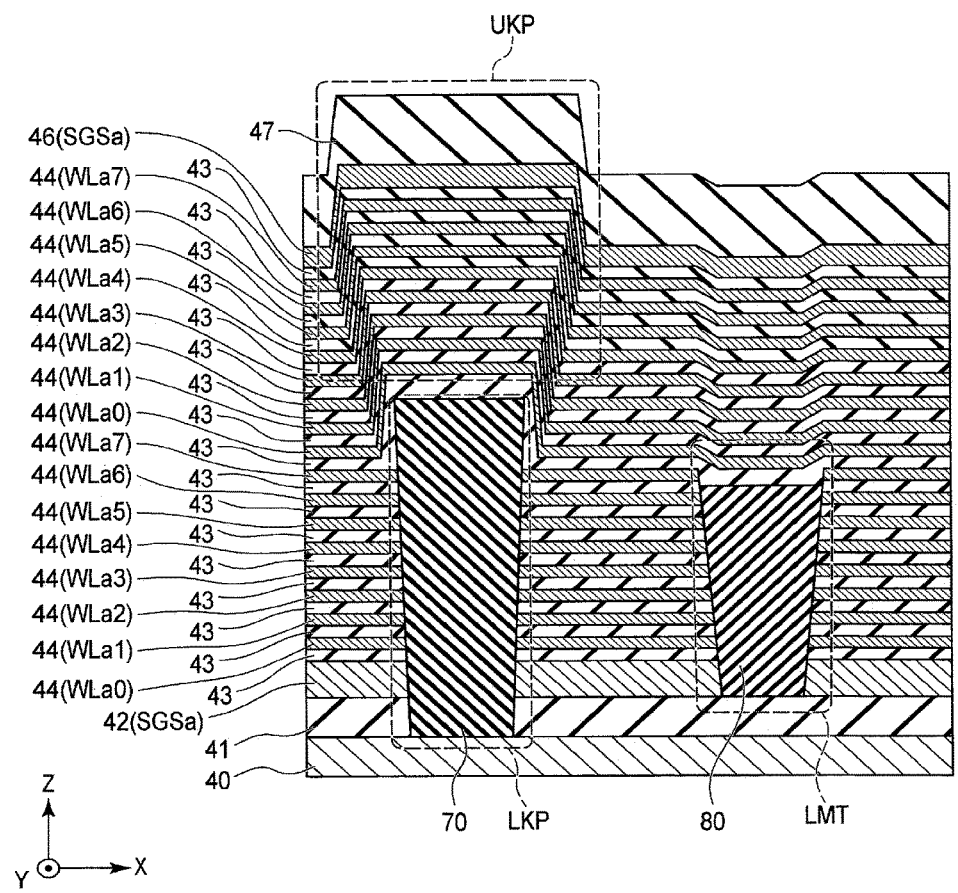
F I G. 9

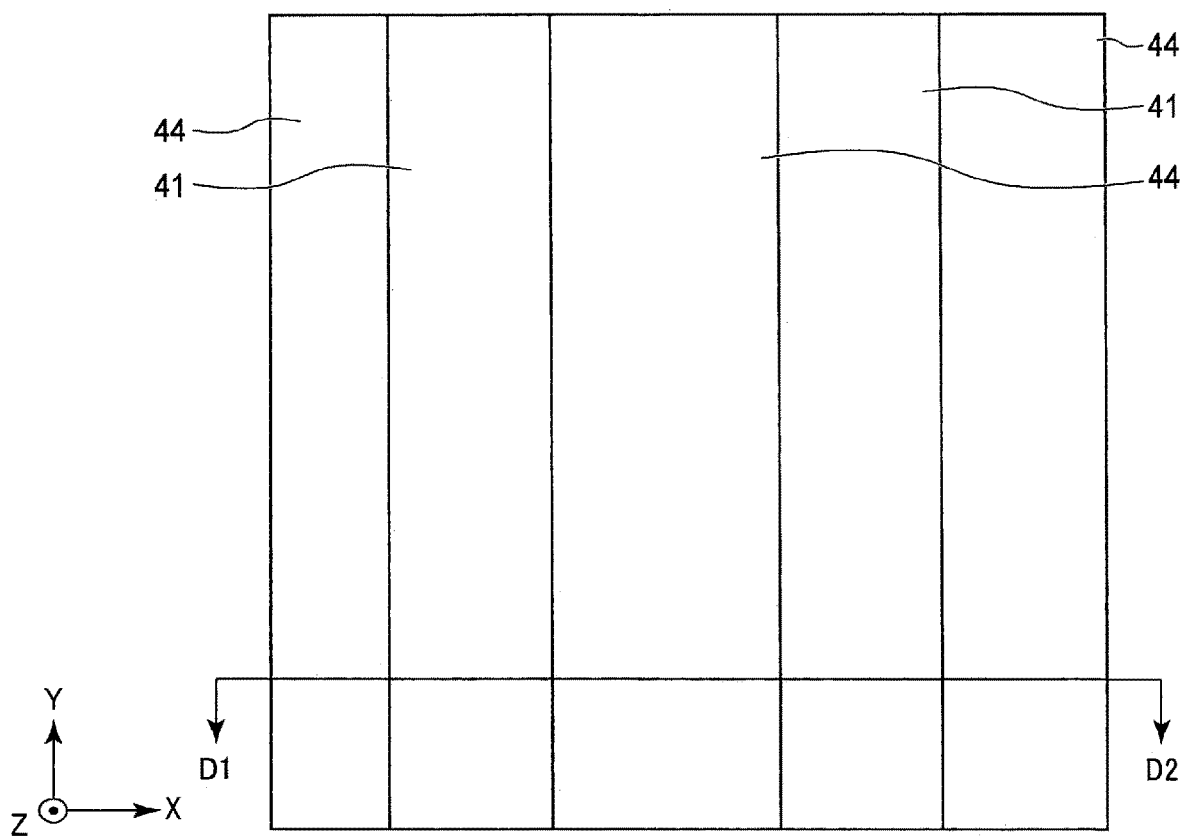
F I G. 13
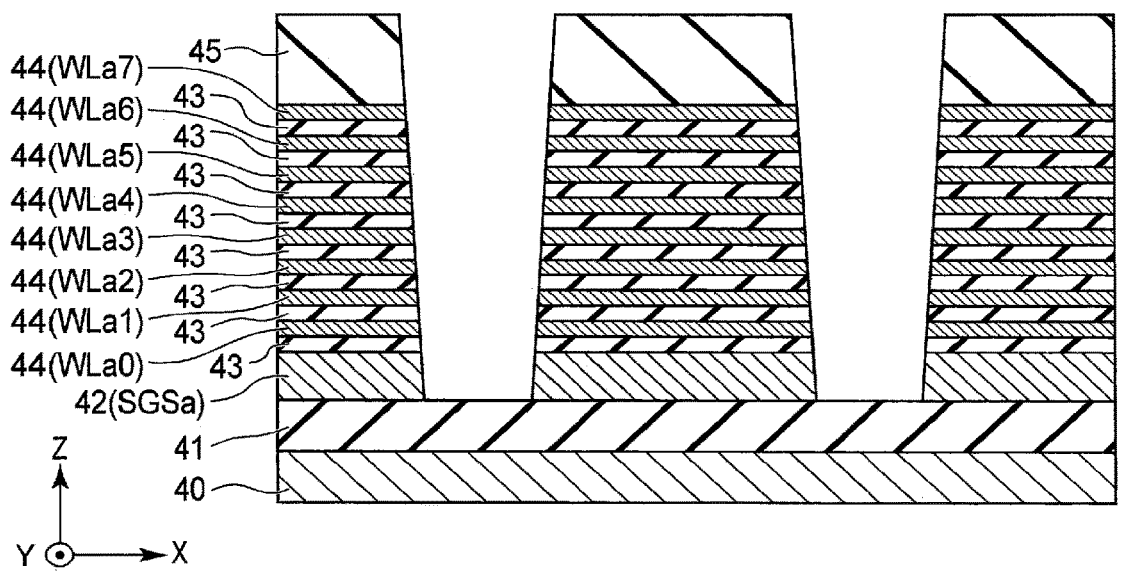
F I G. 14

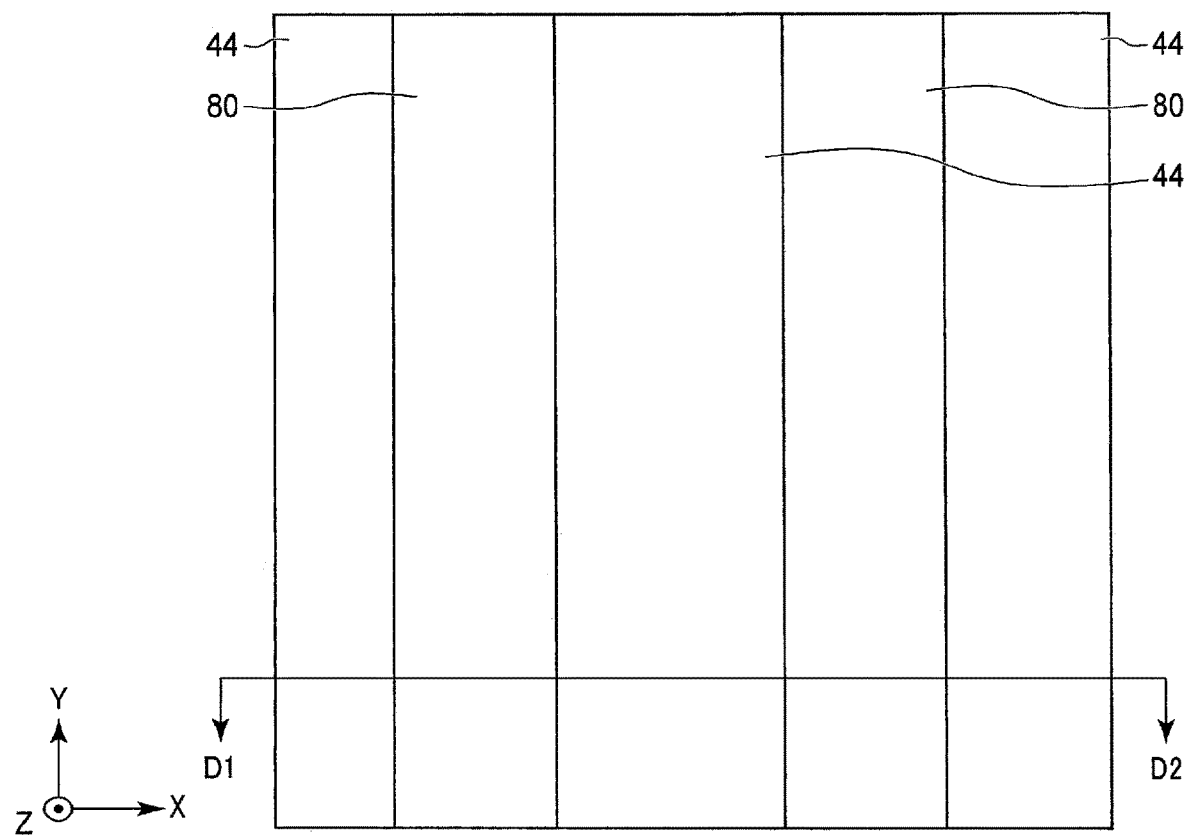
F I G. 15
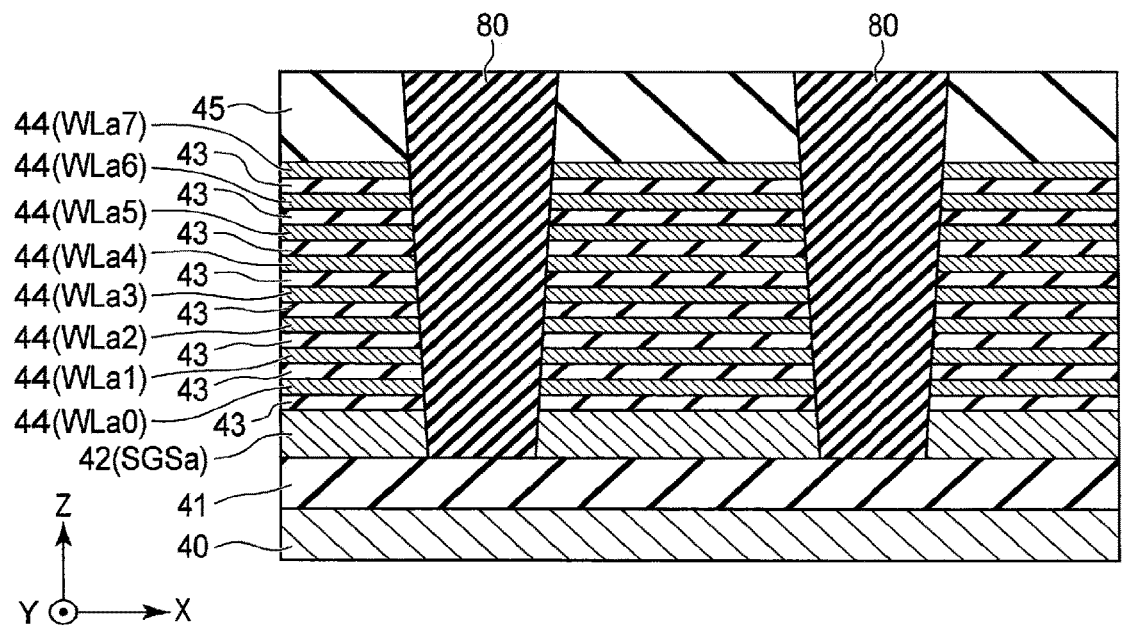
F I G. 16

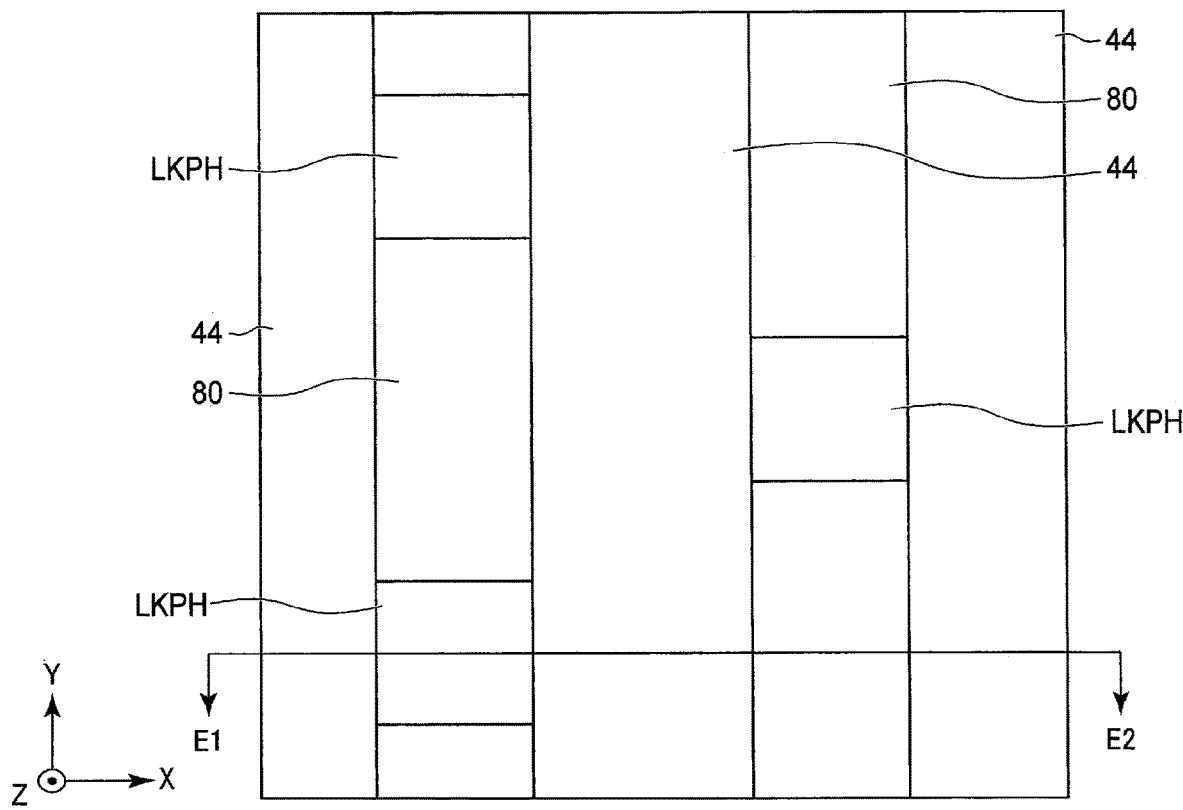
F I G. 17
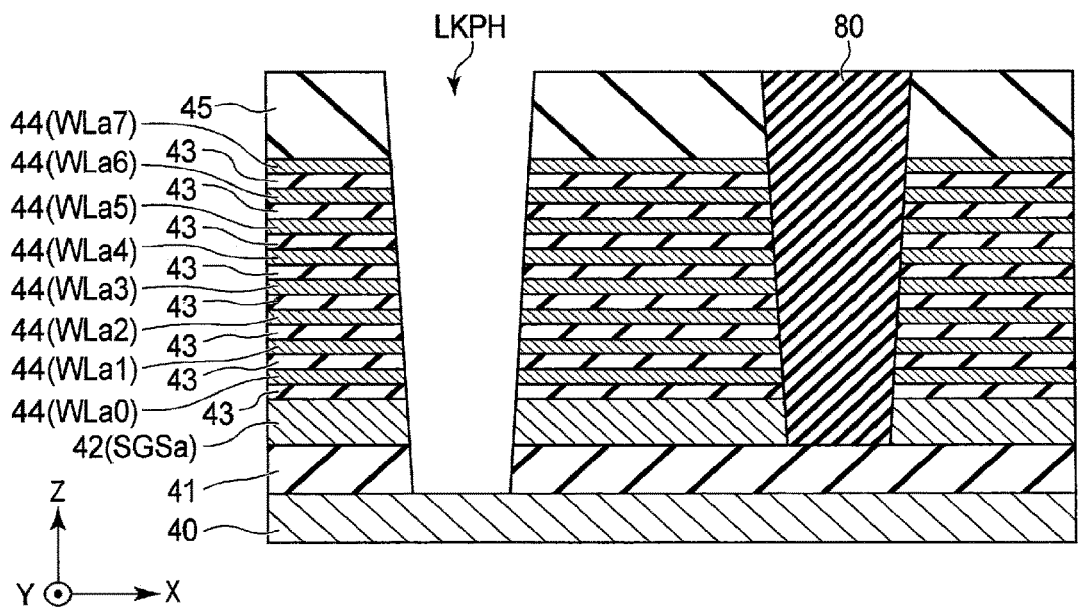
F I G. 18

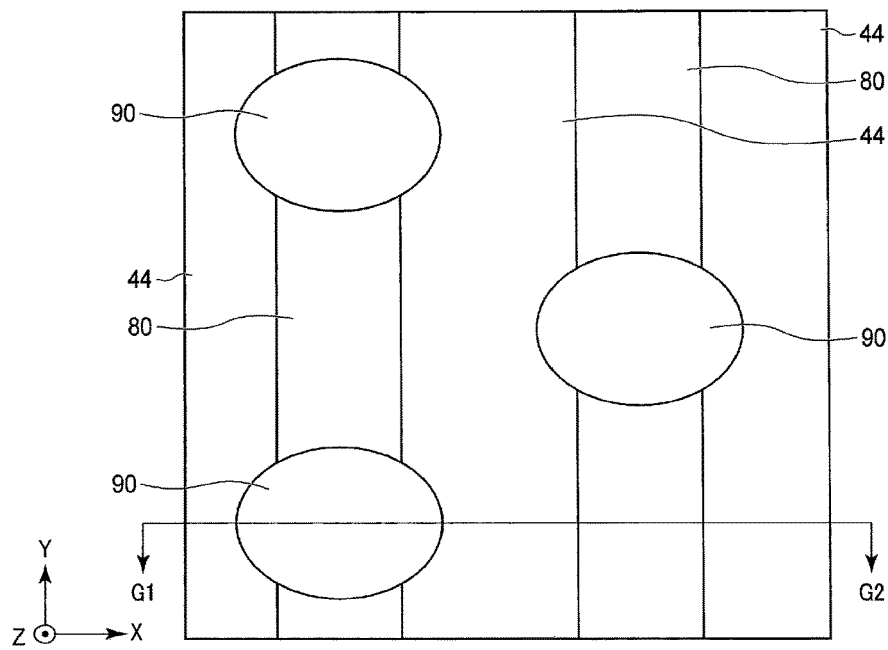
F I G. 23
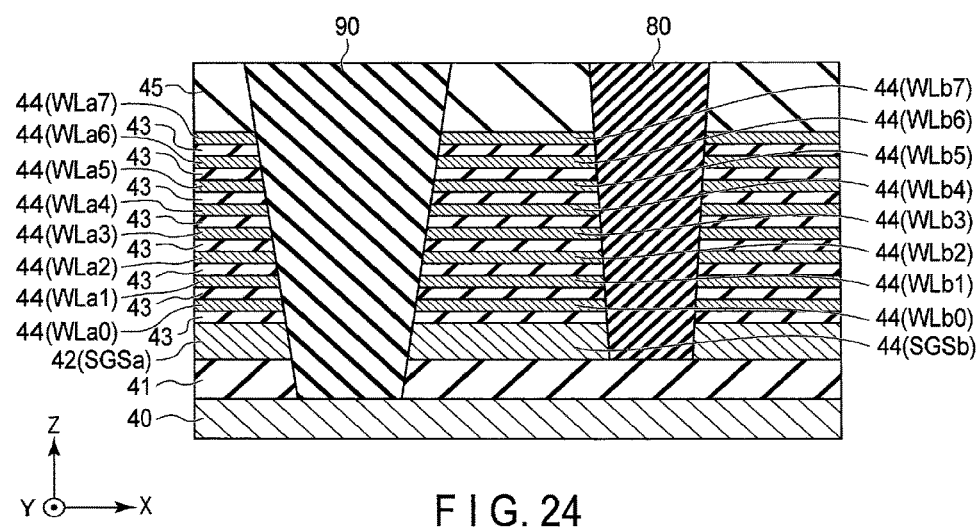
F I G. 24

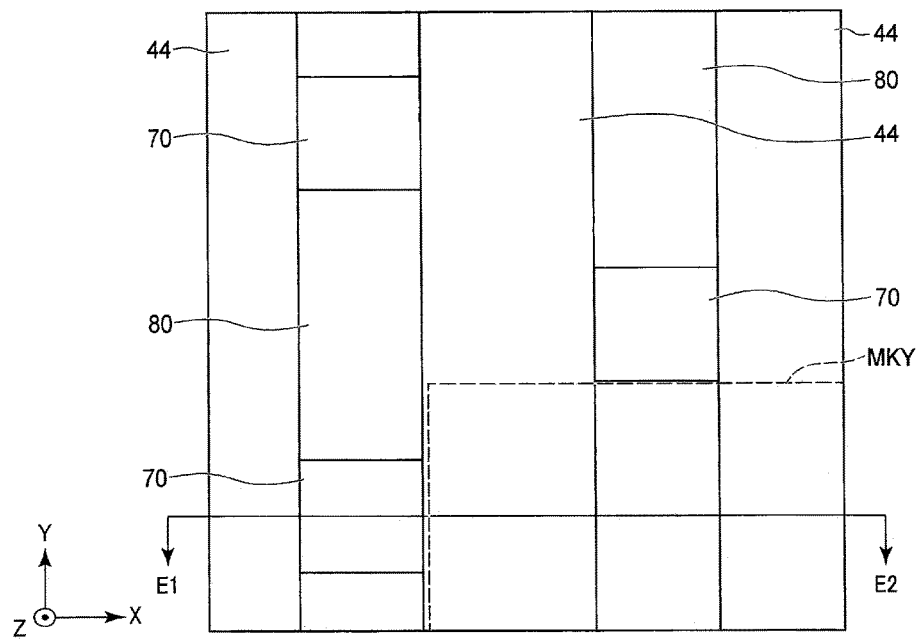
F I G. 25
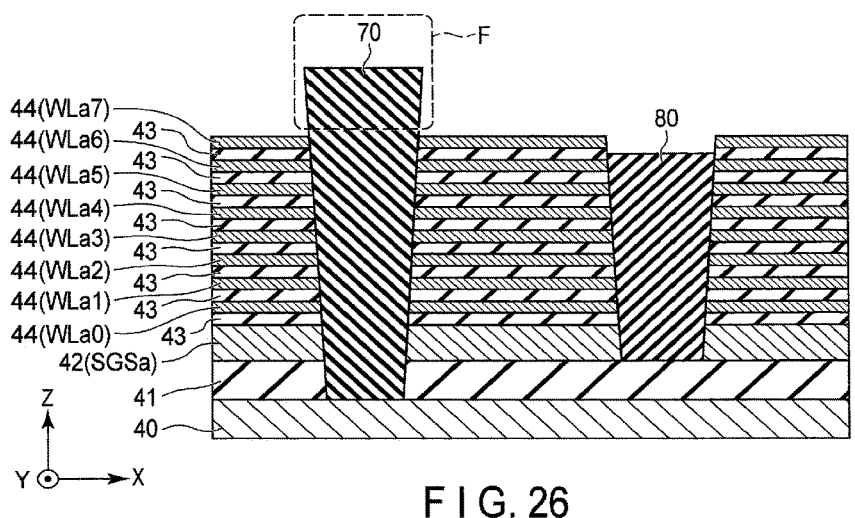
F I G. 26

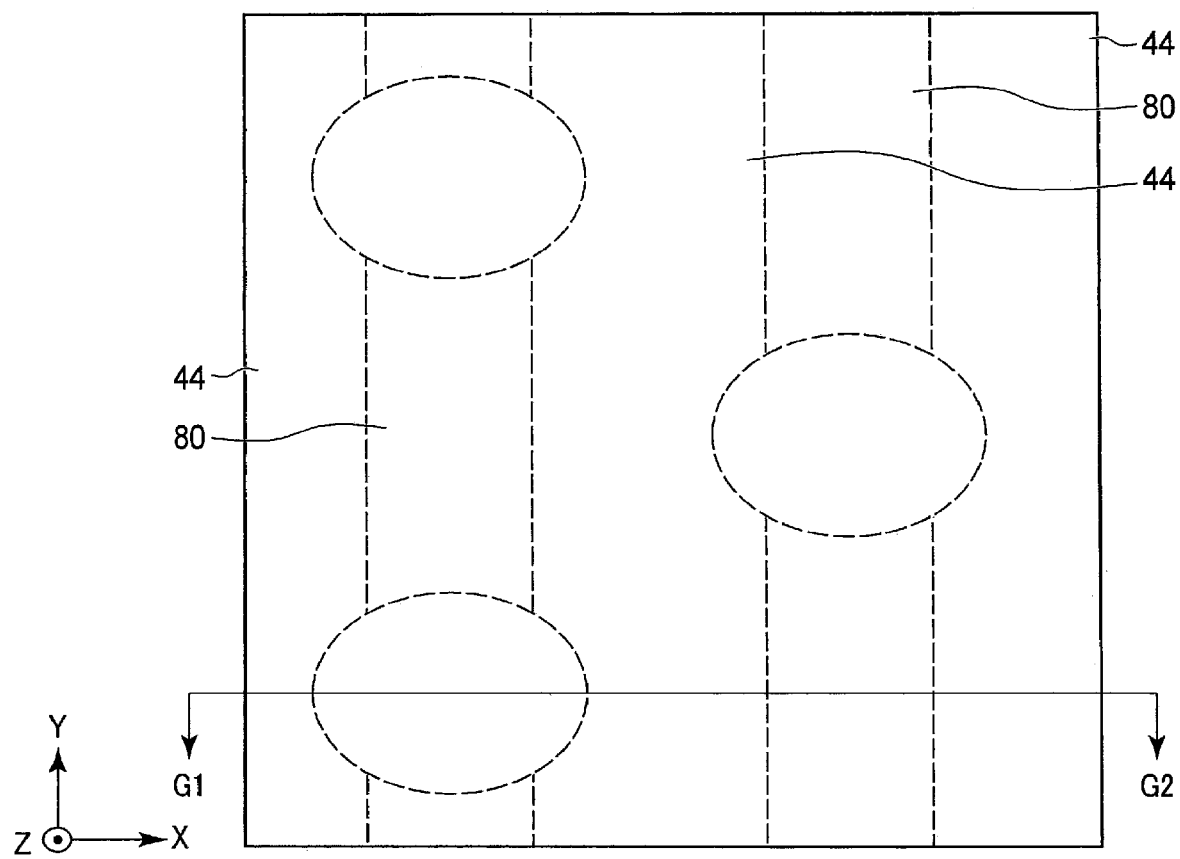
F I G. 27

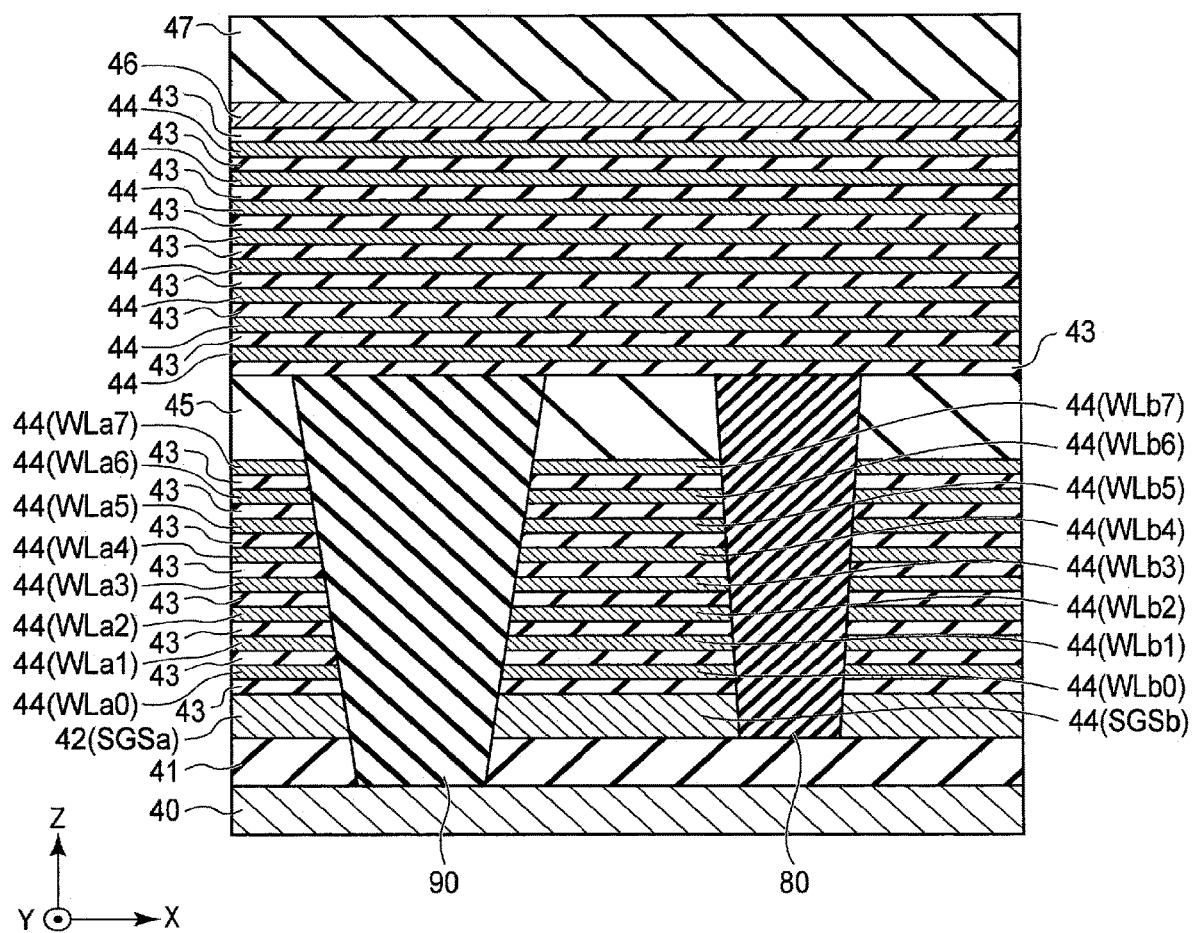
F I G. 28

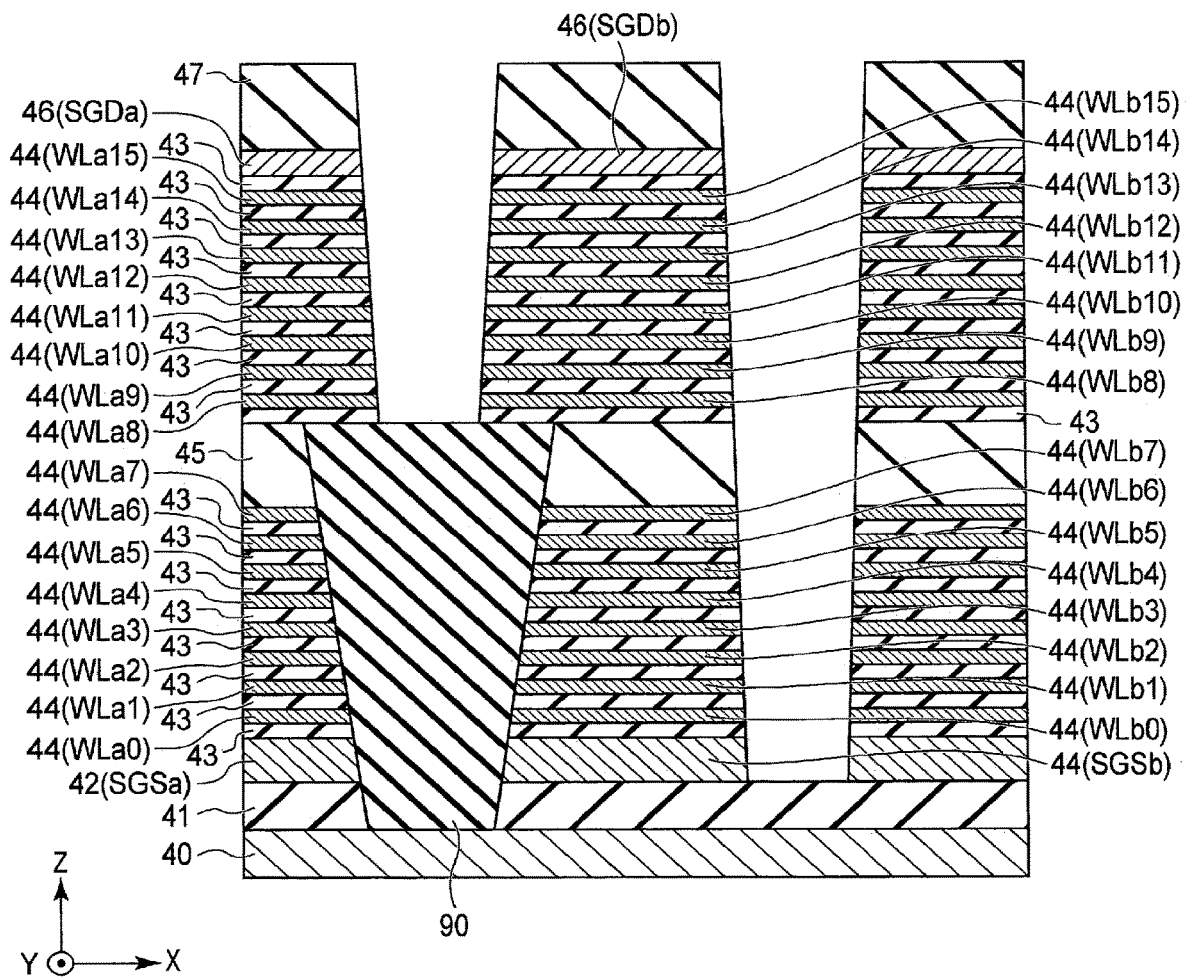
F I G. 30

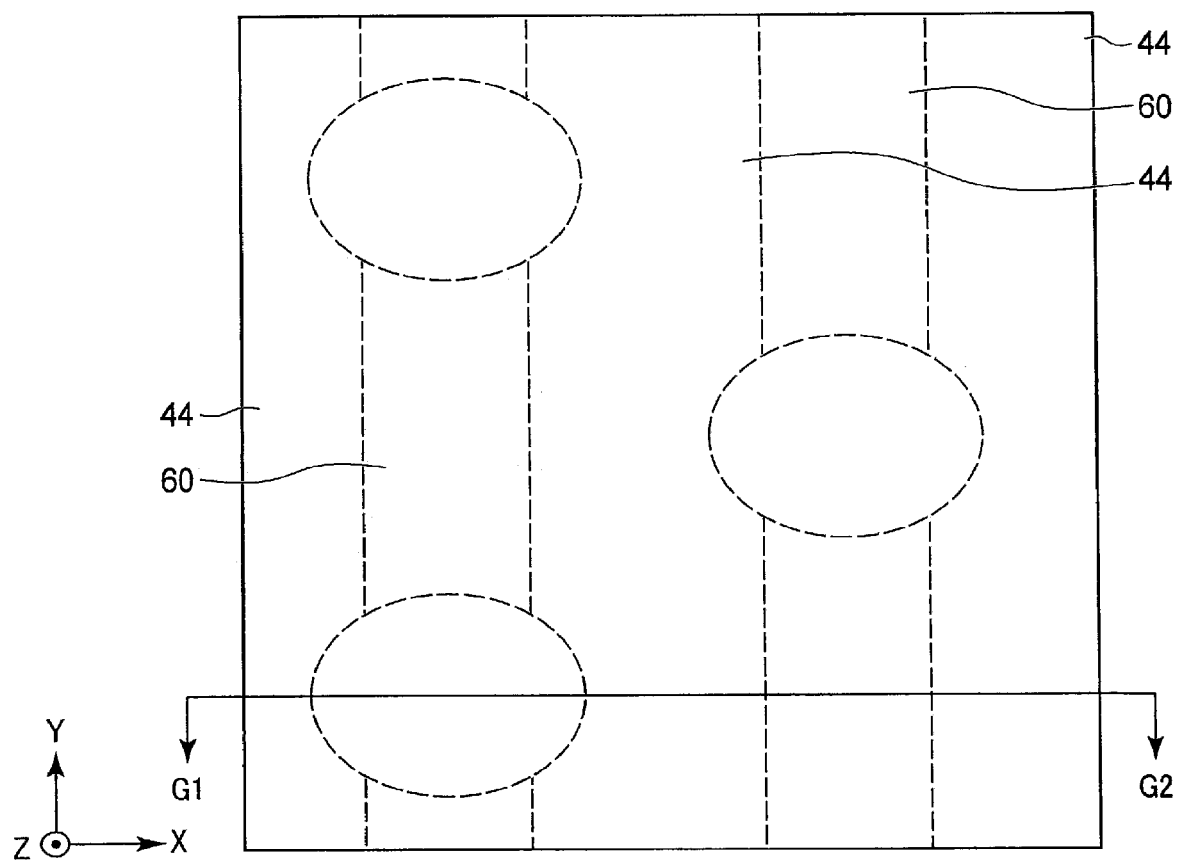
F I G. 31

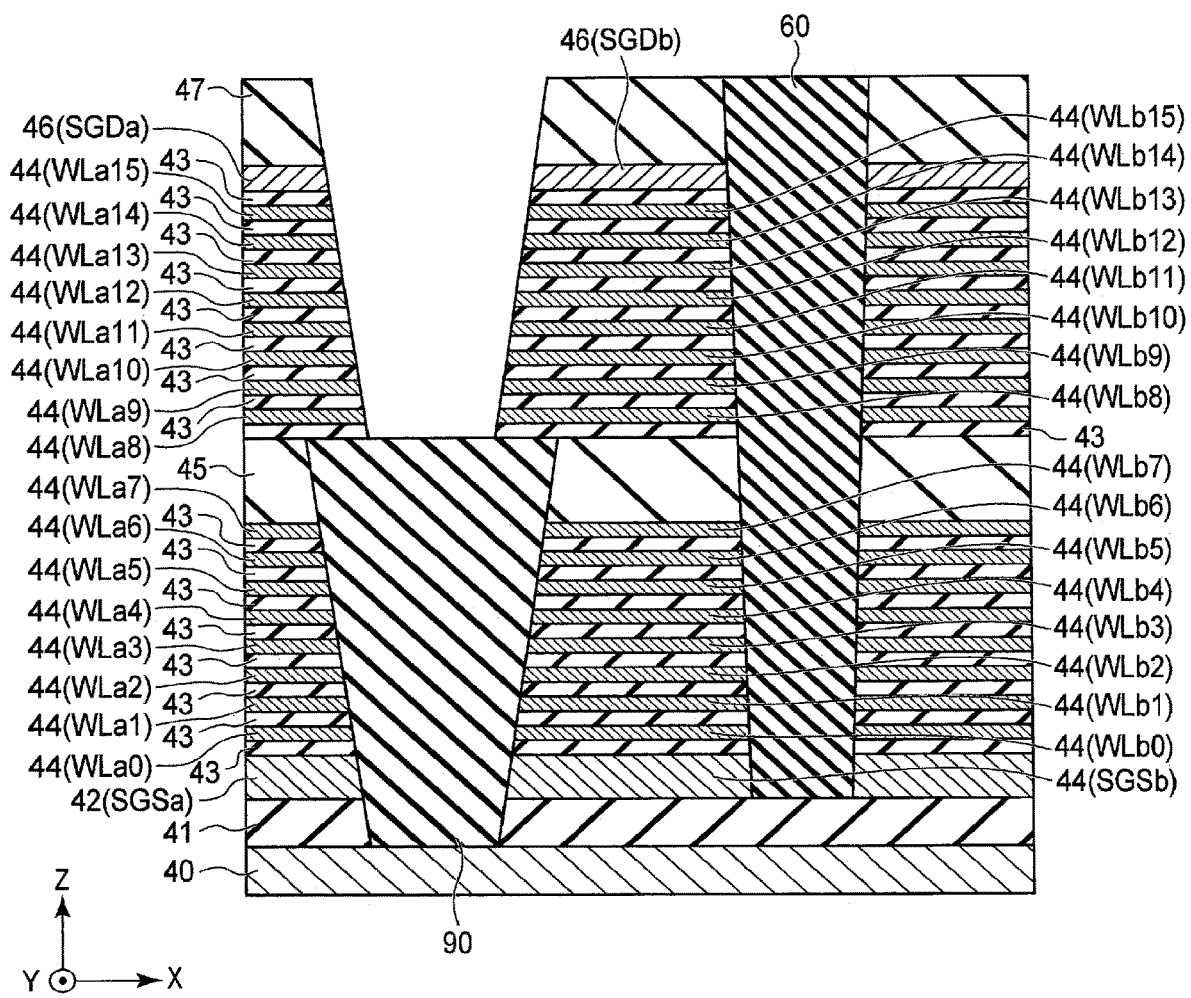
F I G. 34

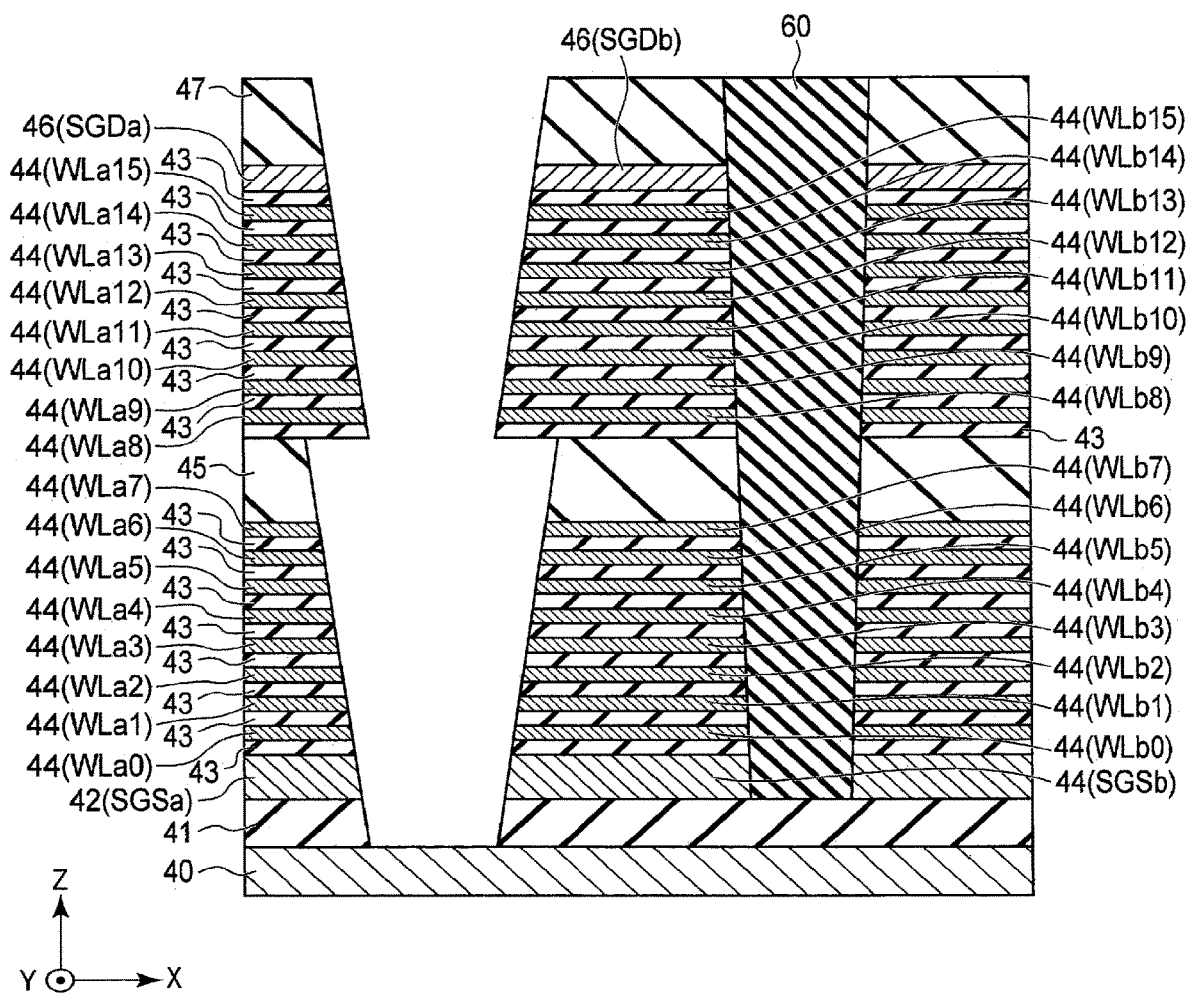
F I G. 36

SEMICONDUCTOR DEVICE

CROSS-REFERENCE TO RELATED APPLICATIONS

This application is based upon and claims the benefit of priority from Japanese Patent Application No. 2019-172099, filed Sep. 20, 2019, the entire contents of which are incorporated herein by reference.

FIELD

Embodiments described herein relate generally to a semiconductor device.

BACKGROUND

A NAND flash memory is known as a semiconductor device.

BRIEF DESCRIPTION OF THE DRAWINGS

FIG. 1 is a block diagram showing an overall configuration of a semiconductor device.

FIG. 8 is a plan view of an area "B" shown in FIG. 7 and within an X-Y plane parallel to word lines WLa0 and WLb0.

FIG. 9 is a cross-sectional view of an alignment mark, taken along line C1-C2 shown in FIG. 8.

FIG. 13 is a top view of the memory cell array 11 and the mark area 30 in a manufacturing step.

FIG. 14 is a cross-sectional view of a memory cell array 11 and the mark area 30, taken along line D1-D2 shown in FIG. 13.

FIG. 15 is a top view of the memory cell array 11 and the mark area 30 in a manufacturing step.

FIG. 16 is a cross-sectional view of the memory cell array 11 and the mark area 30, taken along line D1-D2 shown in FIG. 15.

FIG. 17 is a top view of the mark area 30 in a manufacturing step.

FIG. 18 is a cross-sectional view of the mark area 30, taken along line E1-E2 shown in FIG. 17.

FIG. 23 is a top view of the memory cell array 11 in a manufacturing step.

FIG. 24 is a cross-sectional view of the memory cell array 11, taken along line G1-G2 shown in FIG. 23.

FIG. 25 is a top view of the mark area 30 in a manufacturing step.

FIG. 26 is a cross-sectional view of the mark area 30, taken along line E1-E2 shown in FIG. 25.

FIG. 27 is a top view of the memory cell array 11 in a manufacturing step.

FIG. 28 is a cross-sectional view of the memory cell array 11, taken along line G1-G2 shown in FIG. 27.

FIG. 30 is a cross-sectional view of the memory cell array 11, taken along line G1-G2 shown in FIG. 29.

FIG. 31 is a top view of the memory cell array 11 in a manufacturing step.

FIG. 34 is a cross-sectional view of the memory cell array 11, taken along line G1-G2 shown in FIG. 33.

FIG. 36 is a cross-sectional view of the memory cell array 11, taken along line G1-G2 shown in FIG. 35.

DETAILED DESCRIPTION

Figure 2:
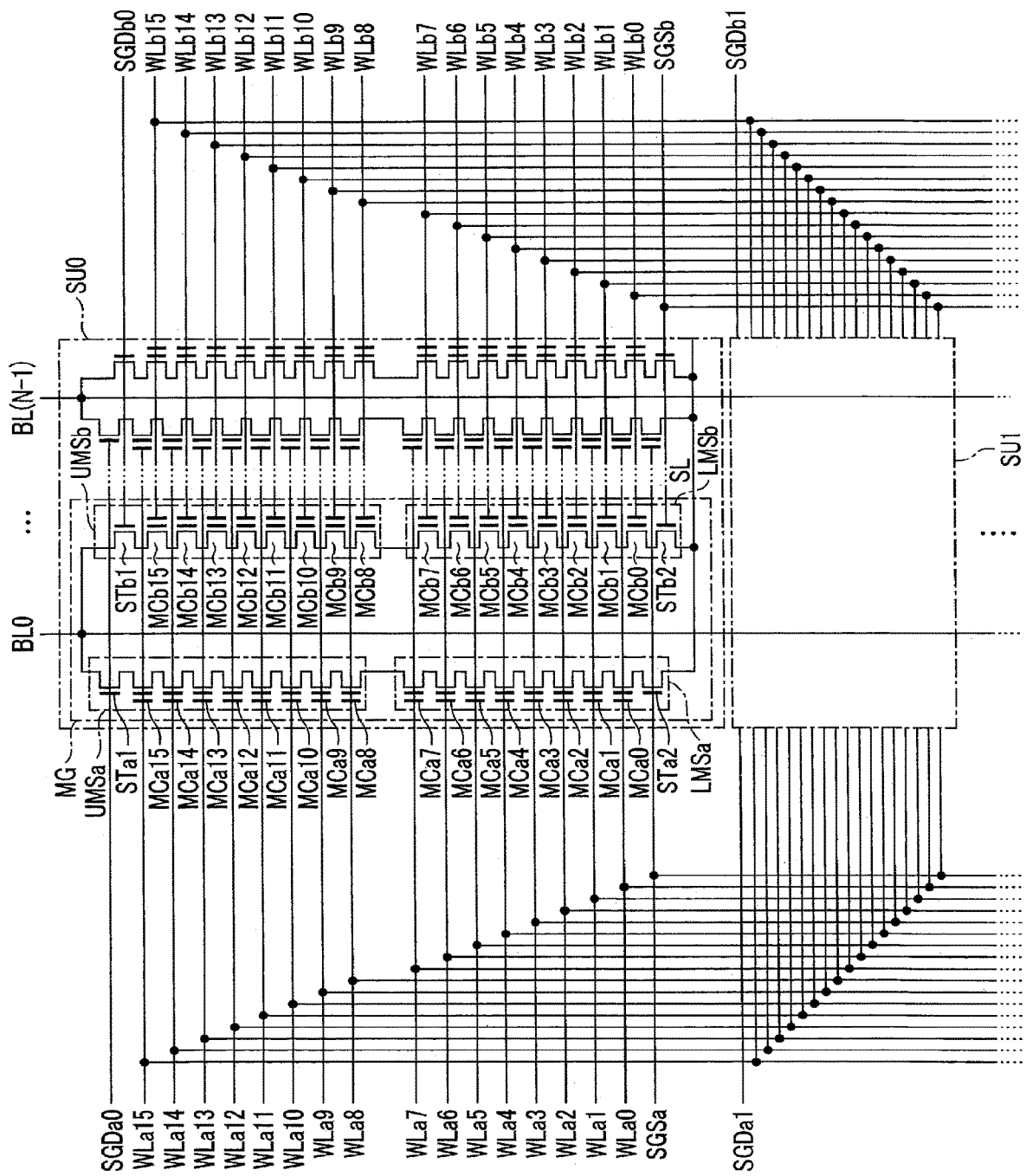
FIG. 2 is a circuit diagram of a memory cell array 11 in a single block BLK.

In general, according to one embodiment, a semiconductor device includes: a first stacked structure in which first insulating layers and first conductive layers are alternately stacked in a first direction; a second stacked structure in which second insulating layers and second conductive layers are alternately stacked in the first direction; a first memory pillar provided in the first stacked structure; a first dividing structure extending in a second direction orthogonal to the first direction and dividing the first conductive layers in a third direction orthogonal to the first and second directions; a second memory pillar provided within the second stacked structure and connected to the first memory pillar, the second stacked structure being provided via a third insulating layer arranged on the first stacked structure; a second dividing structure extending in the second direction and dividing the second conductive layers in the third direction; a first alignment mark pillar provided in the first stacked structure and projecting from the first stacked structure in the first direction; a second alignment mark pillar provided on the first alignment mark pillar, and constituted by a projection of the second stacked structure in the first direction; an alignment mark surrounded by the second alignment mark pillar.

Hereinafter, the embodiments will be described with reference to the accompanying drawings. In the following descriptions, structural elements having approximately the same function and configuration will be assigned the same reference symbol, and a repetitive description will be given only where necessary. Each of the embodiments described below merely indicates an exemplary apparatus or method for embodying the technical idea of the embodiment. The structural elements' materials, shapes, structures, arrangements, etc. of the technical ideas of the embodiments are not limited to the ones described below. Various modifications can be made to the technical ideas of the embodiments within the scope of claims.

<1> Embodiment

A semiconductor device according to an embodiment is described. Hereinafter, a three-dimensionally stacked type NAND-type flash memory in which memory cell transistors are three-dimensionally stacked above a semiconductor substrate will be described as an example of the semiconductor device.

<1-1> Configuration

<1-1-1> Overall Configuration of Semiconductor Device

First, an overall configuration of a semiconductor device will be described with reference to FIG. 1. FIG. 1 is a block diagram showing an overall configuration of the semiconductor device. In FIG. 1, some of the couplings between the blocks are indicated by arrows; however, the couplings between the blocks are not limited to those shown in FIG. 1.

As shown in FIG. 1, the semiconductor device 1 includes a memory core part 10 and peripheral circuitry 20.

The memory core part 10 includes a memory cell array 11, a row decoder 12, and a sense amplifier 13.

The memory cell array 11 includes a plurality of blocks BLK. In the example shown in FIG. 1, three blocks BLK0 through BLK2 are shown; however, the number of the blocks is not limited to three. The blocks BLK are associated with rows and columns, and include a plurality of three-dimensionally arranged memory cell transistors.

The row decoder 12 decodes a row address received from an external controller (not shown). The row decoder 12 selects a row direction of the memory cell array 11 based on a result of the decoding. Specifically, the row decoder 12 applies voltages to the interconnects for the selection of a row direction.

When a data read is performed, the sense amplifier 13 senses data from any of the blocks BLK. When a data write is performed, the sense amplifier 13 applies a voltage to the memory cell array 11 in accordance with write data.

The peripheral circuitry 20 includes a sequencer 21 and a voltage generator 22.

The sequencer 21 controls the operation of the entire semiconductor device 1. Specifically, the sequencer 21 controls a voltage generator 22, a row decoder 12, and a sense amplifier 13, etc., when a write operation, a read operation, or an erase operation is performed.

The voltage generator 22 generates voltages necessary for a write operation, a read operation, and an erase operation, and supplies the voltages to the row decoder 12 and the sense amplifier 13, etc.

<1-1-2> Circuit Configuration of Memory Cell Array

Next, the circuit configuration of the memory cell array 11 will be described with reference to FIG. 2. FIG. 2 is a circuit diagram of the memory cell array 11 in a single block BLK.

As shown in FIG. 2, a block BLK includes a plurality of string units SU (SU0, SU1, . . . ). Each string unit SU includes a plurality of memory groups MG. Each memory group MG includes four memory strings LMSa, LMSb, UMSa, and UMSb. The memory string LMSa is coupled in series to the memory string UMSa. The memory string LMSb is coupled in series to the memory string UMSb. The memory strings LMSa and UMSa are coupled in parallel to the memory strings LMSb and UMSb. Hereinafter, the memory strings LMSa and LMSb will be referred to as "memory string LMS", unless specified, and the memory strings UMSa and UMSb will be referred to as "memory string UMS", unless specified. In addition, the memory strings LMS and UMS will be referred to as "memory string MS", unless specified. The number of memory strings MS included in a single memory group MG is not limited to four. The memory group MG may include 2 m (m is 3 or an integer larger than 3) or more memory strings MS.

The memory string LMSa includes eight memory cell transistors MCa0 through MCa7 and a selection transistor STa2, for example. Similarly, the memory string LMSb includes eight memory cell transistors MCb0 through MCb7 and a selection transistor STb2. The memory string UMSa includes eight memory cell transistors MCa8 to MCa15 and a selection transistor STa1, for example. The memory string UMSb includes eight memory cell transistors MCb8 through MCb15 and a selection transistor STb1, for example.

Hereinafter, the memory cell transistors MCa0 to MCa15 and MCb0 to MCb15 will be referred to as "memory cell transistors MCa and MCb", respectively, unless specified. Furthermore, the memory cell transistors MCa and MCb will be referred to as "memory cell transistors MC", unless specified.

Each memory cell transistor MC is provided with a control gate and a charge storage layer, and stores data in a nonvolatile manner. Each memory cell transistor MC may be either of a MONOS (metal-oxide-nitride-oxide-silicon) type that uses an insulating layer as the charge storage layer, or an FG (floating gate) type that uses a conductive layer as the charge storage layer. In the present embodiment, a MONOS-type memory cell transistor will be described as an example. The number of memory cell transistors MC included in each memory string MS may be 16, 32, 48, 64, 96, or 128, etc., and the number is not limited to these numbers.

The memory cell transistors MC and the selection transistor ST2 included in the memory string LMSa are coupled in series. Specifically, the current paths of the selection transistor STa2 and the memory cell transistors MCa0 through MCa7 are coupled in series. Similarly, the current paths of the selection transistor STb2 and the memory cell transistors MCb0 through MCb7 included in the memory string LMSb, are coupled in series. The sources of the selection transistors STa2 and STb2 are coupled in common to the source line SL.

The memory cell transistors MCa8 through MCa15 and the selection transistors STa1 included in the memory cell transistor UMSa are coupled in series. Similarly, the memory cell transistors MCb8 through MCb15 and the selection transistor STb1 included in the memory cell transistor UMSb are coupled in series. The source of the memory cell transistor MCa8 and the drain of the memory cell transistor MCa7 are coupled. The source of the memory cell transistor MCb8 and the drain of the memory cell transistor MCb7 are coupled. The drains of the selection transistors STa1 and STb1 are coupled in common to one of a plurality of bit lines BL (BL0, . . . , BL(N−1), herein (N−1) is an integer equal to or greater than 2).

Select gate lines SGDa (SGDa0, SGDa1, . . . ) and select gate lines SGDb (SGDb0, SGDb1, . . . ) are provided in correspondence to a string unit SU (SU0, SU1, . . . ). The gates of a plurality of selection transistors STa1 in a string unit SU are coupled in common to a corresponding select gate line SGDa. Similarly, the gates of the plurality of the selection transistors STb1 in a string unit SU are coupled in common to a corresponding select gate line SGDb. Hereinafter, the select gate lines SGDa through SGDb will be referred to as "select gate lines SGD", unless specified. Each select gate line SGD is independently controlled by the row decoder 12.

Select gate lines SGSa and SGSb are provided in correspondence to a block BLK. In each block BLK, the gates of a plurality of the select transistors STa2 are coupled to a corresponding select gate line SGSa, and the gates of a plurality of the select transistors STb2 are coupled to a corresponding select gate line SGSb. The select gate lines SGSa and SGSb may be coupled in common to the row decoder 12, for example, and may be independently controlled by the row decoder 12. Hereinafter, the select gate lines SGSa through SGSb will be referred to as "select gate lines SGS", unless specified.

In each block BLK, the control gates of a plurality of the memory cell transistors MCa0 through MCa15 and MCb0 through MCb15 are respectively coupled in common to the word lines WLa0 through WLa15 and the word lines WLb0 through WLb15 provided in each block BLK. The word lines WLa0 through WLa15 and WLb0 through WLb15 are independently controlled by the row decoder 12. Hereinafter, the word lines WLa and WLb will be referred to as "word lines WL", unless specified.

A block BLK is a unit of data erasure, for example, and data stored in memory cell transistors MC included in a block BLK is erased in a batch. Each of a write operation and a read operation is performed to the entire memory cell transistors MC coupled to one word line WL of one string unit SU in common.

In the memory cell array 11, the drains of the selection transistors STa1 and STb1 in a plurality of memory groups MG arranged in the same row are coupled in common to one bit line BL. In other words, a bit line BL couples in common the memory groups MG between a plurality of string units SU. Accordingly, the string unit SU includes a plurality of memory groups MG coupled to different bit lines BL and coupled to the same select gate line SGD. The block BLK includes a plurality of string units SU sharing the word lines WL. The memory cell array 11 includes a plurality of blocks BLK sharing the bit lines BL. In the memory cell array 11, the select gate lines SGS, the word lines WL, and the select gate lines SGD are stacked above the semiconductor substrate; accordingly, the memory cell transistors MC are stacked three-dimensionally.

<1-1-3> Overall Configuration of Semiconductor Device

Figure 3:
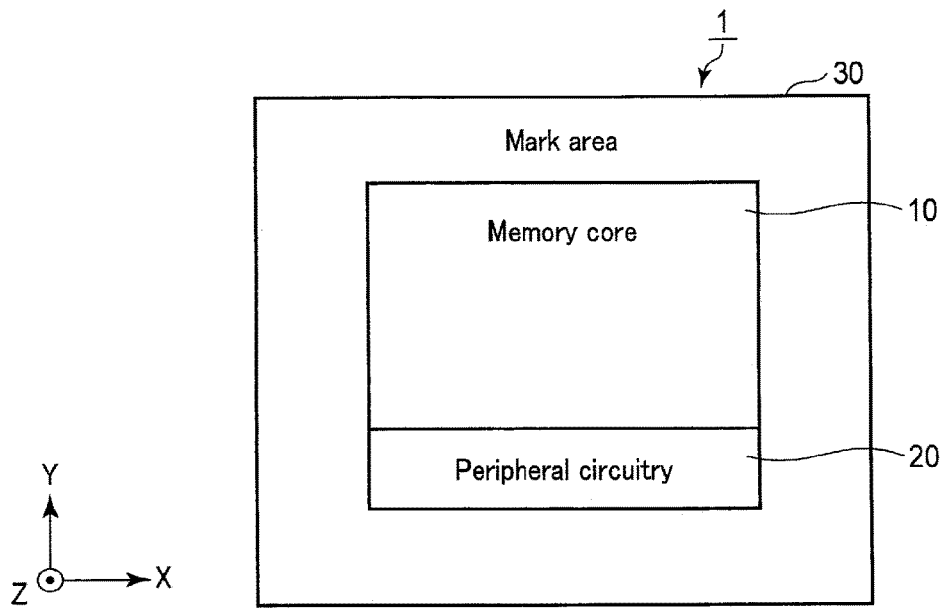
FIG. 3 is a top view of a semiconductor device 1.

Next, an overall configuration of the semiconductor device 1 will be described with reference to FIG. 3. FIG. 3 is a top view of the semiconductor device 1.

As shown in FIG. 3, in the semiconductor device 1, a peripheral circuitry 20 is arranged adjacent to one of the X-direction sides of the memory core part 10, and a mark area 30 is provided in the periphery of the memory core part 10 and the peripheral circuitry 20 (except for the part where the memory core part 10 and the peripheral circuitry 20 are adjacent to each other).

The mark area 30 is an area where alignment marks used in the manufacture of the semiconductor device 1 are formed.

<1-1-3-1> Overall Configuration of Memory Cell Array 11

Figure 4:
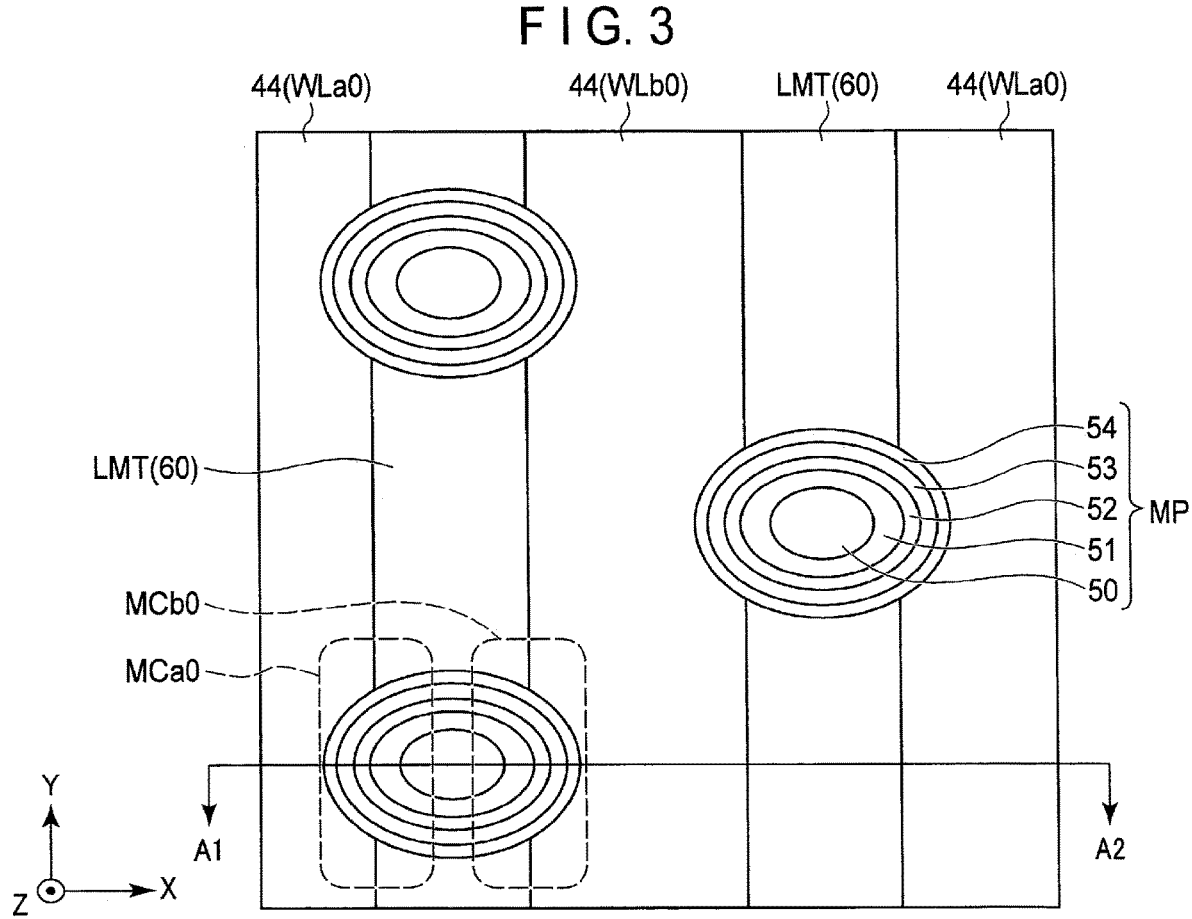
FIG. 4 shows a plane within an X-Y plane parallel to word lines WLa0 and WLb0.
Figure 5:
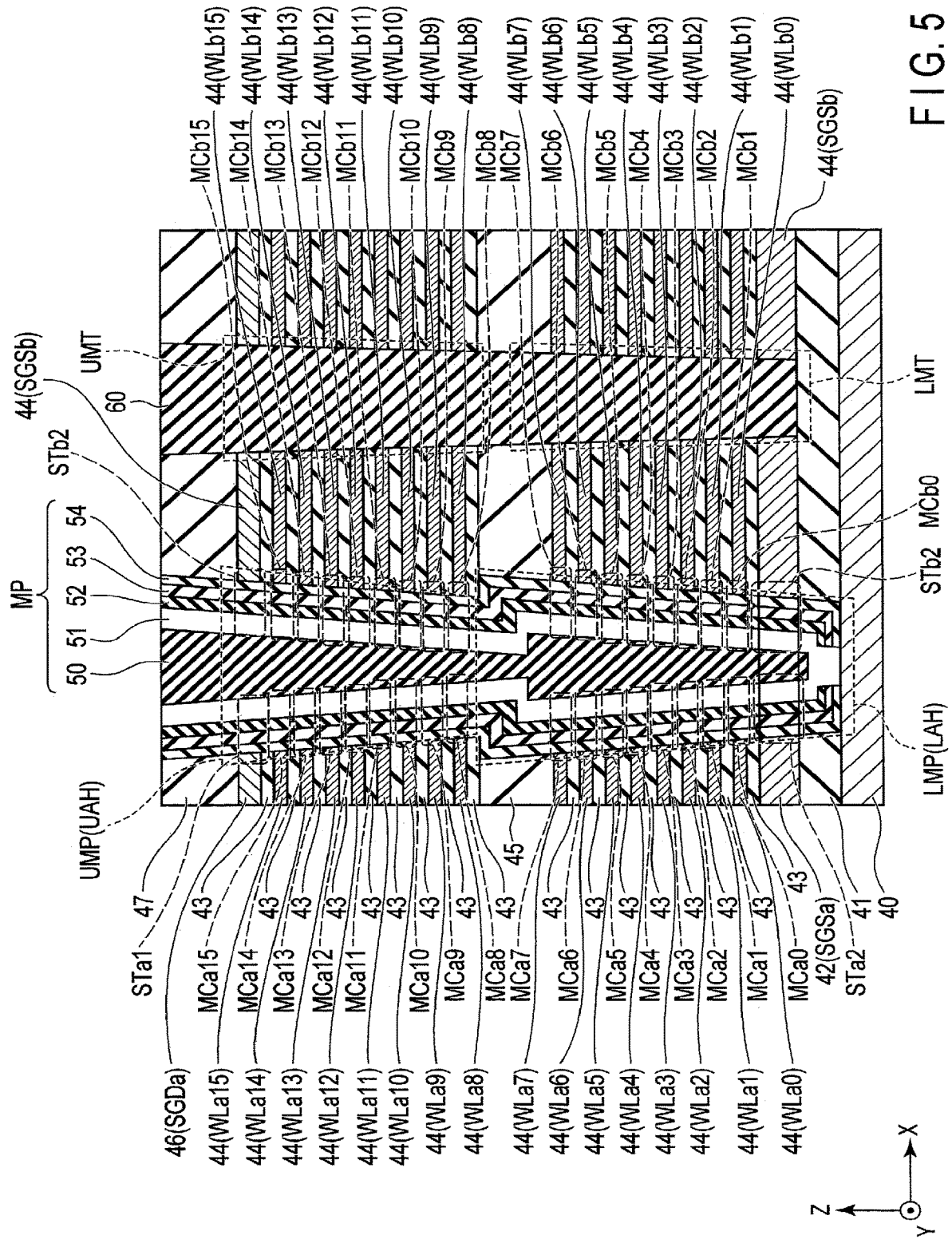
FIG. 5 is a cross-sectional view of the memory cell array 11, taken along line A1-A2 shown in FIG. 4.

Next, the overall configuration of the memory cell array 11 will be described with reference to FIGS. 4 and 5. FIG. 4 is a plan view within an X-Y plane parallel to word lines WLa0 and WLb0. FIG. 5 is a cross-sectional view of a memory cell array 11, taken along line A1-A2 shown in FIG. 4.

As shown in FIGS. 4 and 5, an interconnect layer 40 extending in the X-Y plane parallel to a semiconductor substrate (not shown) is formed above a semiconductor substrate. The interconnect layer 40 functions as a source line SL. Above the interconnect layer 40, the interconnect layer 42 extending in a Y direction is stacked with a space being interposed therebetween with respect to a Z direction, which is perpendicular to the semiconductor substrate. In other words, the interconnect layer 42 is stacked above the interconnect layer 40 with an inter-layer insulating film 41 being interposed therebetween. The interconnect layer 42 functions as a select gate line SGS, or a gate electrode used for generating an erasure current when an erase operation is performed.

Above the interconnect layer 42, eight layers of inter-layer insulating film 43 and eight layers of interconnect layer 44 are alternately stacked in the Z direction. The eight layers of the interconnect layer 44 extend in the Y direction, and function as word lines WL0 through WL7 respectively.

A hole LAH is formed on the interconnect layer 40. The inside of the hole LAH is filled with a block insulating film 54, a charge storage layer 53, a tunnel insulating film 52, a semiconductor layer 51, and a core layer 50, and a memory pillar LMP is thereby formed.

Then, a memory trench LMT extending in the Y direction is formed on the interconnect layer 42 in a manner such that the eight layers of interconnect layer 44 are divided with respect to the X direction. The inside of the memory trench LMT is filled with an insulating layer 60. For the insulating layer 60, $SiO_2$ is used, for example.

A single memory pillar LMP functions as memory strings LMSa and LMSb belonging to one memory group MG.

On the interconnect layers 44, eight layers of the inter-layer insulating film 43 and eight layers of the interconnect layer 44 are alternately stacked, with the inter-layer insulating film 45 being interposed between the interconnect layers 44 and the layer stack. The eight layers of the interconnect layer 44 extend in the Y direction, and respectively function as word lines WL8 through WL15. Above the interconnect layer 44, the interconnect layer 46 is provided with the inter-layer insulating film 43 being interposed therebetween. The interconnect layer 46 extends in the Y direction, and functions as a select gate line SGD.

A hole UAH is formed on the memory pillar LMP. The inside of the hole UAH is filled with the block insulating film 54, the charge storage layer 53, the tunnel insulating film 52, the semiconductor layer 51, and the core layer 50, and a memory pillar UMP is thereby formed.

Then, the memory trench UMT extending in the Y direction is formed on the memory trench LMT in a manner such that the eight layers of interconnect layer 44 are divided with respect to the X direction. The inside of the memory trench UMT is filled with the insulating layer 60. For the insulating layer 60, $SiO_2$ is used, for example.

A conductive layer (not shown) is formed on the memory pillar UMP. A contact plug (not shown) is formed on the conductive layer. The upper surface of the contact plug is coupled to the bit line BL extending in the X direction, for example.

The interconnect layers 42, 44, and 46 are made of a conductive material, which may, for example, take the form of an n-type or p-type semiconductor doped with impurities, or a metal material. In the present embodiment, an example where tungsten (W) and titanium nitride (TiN) are used for the interconnect layers 42, 44, and 46 will be explained. TiN functions as a barrier metal or an adhesion layer when W is formed.

For the block insulating film 54, the tunnel insulating film 52, and the core layer 50, a silicon dioxide ($SiO_2$) film is used, for example. For the charge storage layer 53, a silicon nitride film (SiN) or hafnium oxide (HfO) is used, for example. The semiconductor layer 51 is an area where channels of the memory cell transistors MC are formed. For this reason, the semiconductor layer 51 functions as a signal line connecting the current paths of the memory cell transistors MC. For the semiconductor layer 51, polycrystalline silicon is used, for example.

In the example shown in FIG. 5, the interconnect layer 42, which is arranged on the left-hand side of the drawing with respect to the memory pillar LMP, functions as the select gate line SGSa, and the eight layers of the interconnect layer 44 respectively function as the word lines WLa0 through WLa7, from the bottom to the top. For example, a memory cell transistor MCa0 is constituted by an area that includes the interconnect layer 44 functioning as the word line WLa0, and also the parts of the block insulating film 54, the charge storage layer 53, the tunnel insulating film 52, and the semiconductor layer 51 provided on the left-hand side of the memory pillar LMP. The other memory cell transistors MCa1 through MCa7 and the selection transistor STa2 are constituted in a similar manner.

The interconnect layer 42 arranged on the right-hand side of the drawing functions as a select gate line SGSb, and the eight layers of the interconnect layer 44 respectively function as the word lines WLb0 through WLb7, from the bottom toward the top. For example, a memory cell transistor MCb0 is constituted by an area that includes the interconnect layer 44 functioning as the word line WLb0, and also the parts of the block insulating film 54, the charge storage layer 53, the tunnel insulating film 52, and the semiconductor layer 51 provided on the right-hand side of the memory pillar LMP. The other memory cell transistors MCb1 through MCb7 and the selection transistor STb2 are constituted in a similar manner.

Thus, the memory cell transistors MCa0 and MCb0 are formed on the same layer, and the interconnect layers 44 respectively corresponding to the memory cell transistors MCa0 and MCb0 are divided from each other on the same layer (the X-Y plane). The other memory cell transistors MCa and MLb are constituted in a similar manner. The selection transistors STa2 and STb2 are also constituted in a similar manner.

Above the memory pillar LMP, eight layers of the interconnect layer 44 functioning as word lines WL8 through WL15, and the interconnect layer 46 functioning as the select gate line SGD are sequentially stacked, with interlayer insulating films 43 being respectively interposed. The interconnect layer 46 is, similarly to the interconnect layers 42 and 44, made of a conductive material and, for example, an n-type or p-type semiconductor doped with impurities, or a metal material may be used.

In the example of FIG. 5, the eight layers of interconnect layer 44, arranged on the left-hand side of the drawing with respect to the memory pillar UMP, function as the word lines WLa8 through WLa15, from the bottom to the top, and the interconnect layer 46 functions as the select gate line SGDa. For example, a memory cell transistor MCa8 is constituted by an area that includes the interconnect layer 44 functioning as the word line WLa8, and also the parts of the block insulating film 54, the charge storage layer 53, the tunnel insulating film 52, and the semiconductor layer 51 provided on the left-hand side of the memory pillar UMP. The other memory cell transistors MCa9 through MCa15 and the selection transistor STa1 are constituted in a similar manner.

The eight layers of the interconnect layer 44 arranged on the right-hand side of the drawing function as word lines WLb8 through WLb15, and the interconnect layer 46 functions as the select gate line SGDb. For example, a memory cell transistor MCb8 is constituted by an area that includes the interconnect layer 44 functioning as the word line WLb8, and also the parts of the block insulating film 54, the charge storage layer 53, the tunnel insulating film 52, and the semiconductor layer 51 provided on the right-hand side of the memory pillar UMP. The other memory cell transistors MCb9 through MCb15 and the selection transistor STb1 are constituted in a similar manner.

Three or more memory pillars MP may be stacked.

<1-1-3-2> Mark Area 30

Figure 6:
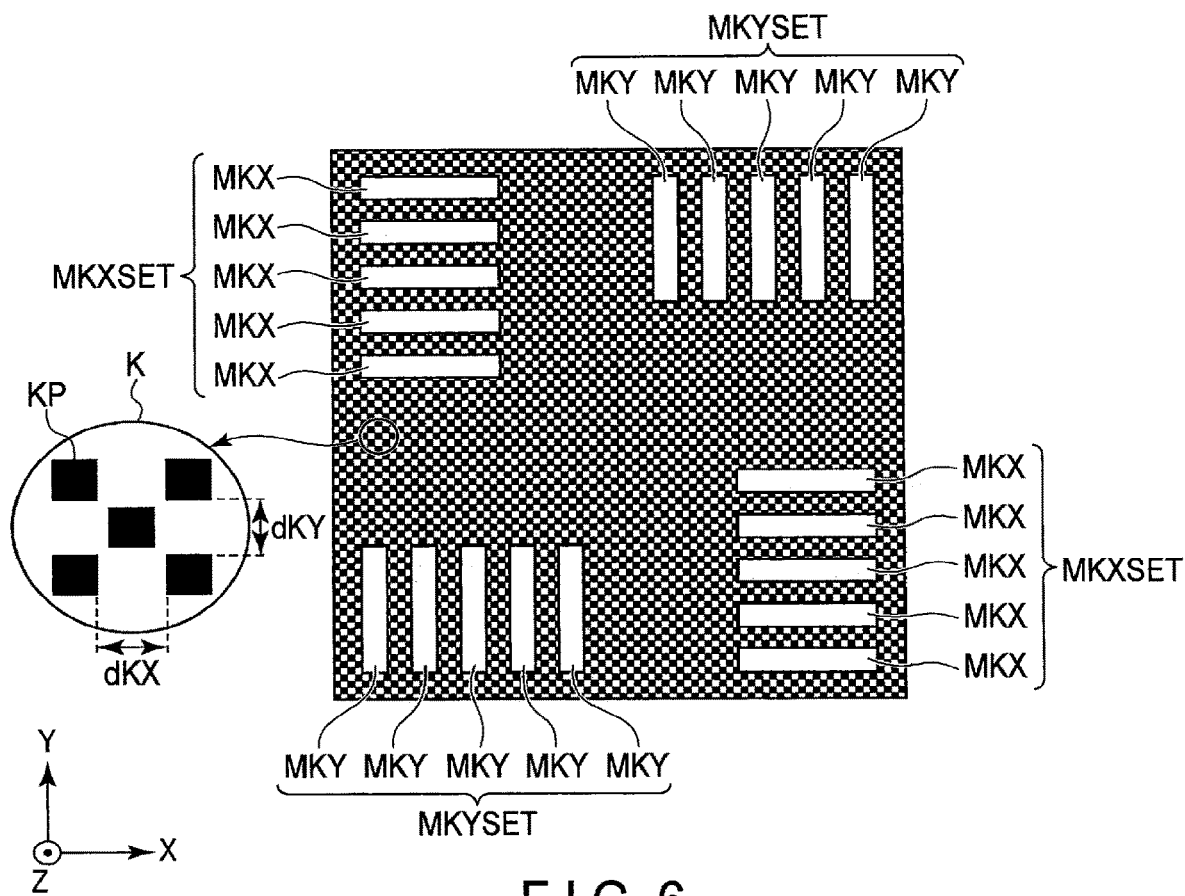
FIG. 6 is a plan view of some alignment marks arranged in a mark area 30.

Subsequently, the alignment marks arranged in the mark area 30 are explained with reference to FIG. 6. FIG. 6 is a plan view of some of the alignment marks arranged in a mark area 30.

As shown in FIG. 6, the alignment marks arranged in the mark area 30 can be roughly categorized as MKX extending in the X direction and MKY extending in the Y direction. The group of alignment marks MKX extending in the X direction will be referred to as the mark set "MKXSET", and group of alignment marks MKY extending in the Y direction will be referred to as the mark set "MKYSET". A user who manufactures the semiconductor device 1 can perform alignment by visually checking the mark sets MKXSET and MKYSET at the time of, for example, manufacturing memory pillars UMP. For example, the mark set MKXSET is used for alignment in the Y direction, and the mark set MKYSET is used for alignment in the X direction.

As indicated by "K" in FIG. 6, there is a first area that does not include the mark sets MKXSET and MKYSET in the mark area 30. In the first area, a plurality of alignment mark pillars KP (also referred to as "mark pillars" or "alignment mark pillars" hereinafter) extending in the Z direction, which are arranged in a two-dimensional lattice in the X-Y plane, are provided. The alignment mark pillars arranged in the X direction are arranged at first intervals dKX with respect to the X direction. The alignment mark pillars arranged in the Y direction are arranged at second intervals dKY with respect to the Y direction.

Figure 7:
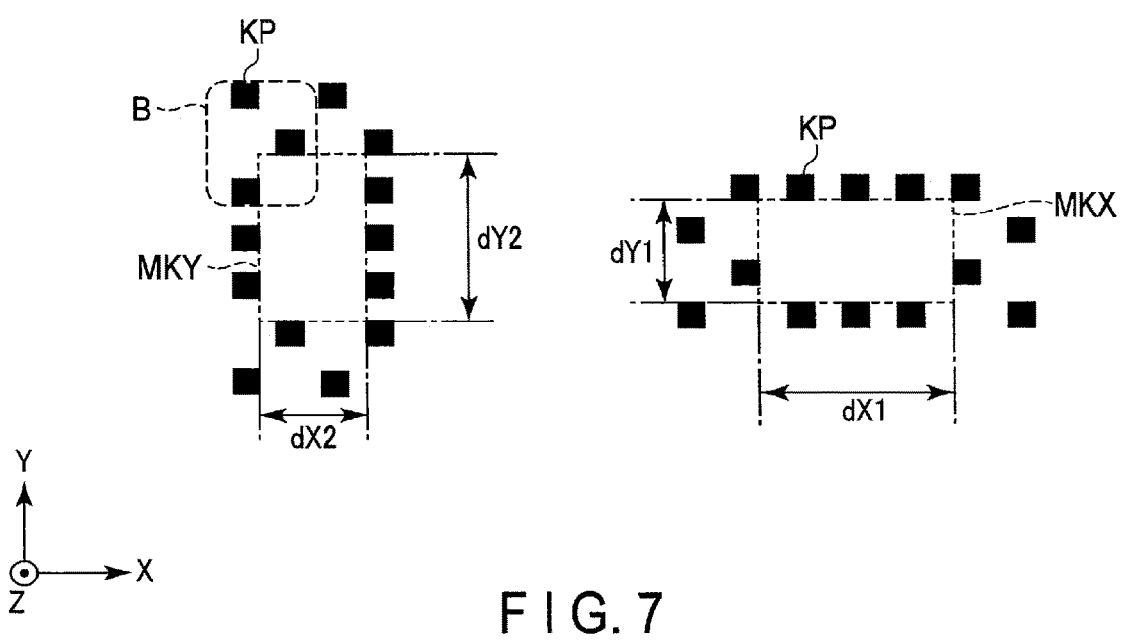
FIG. 7 is a plan view of a single alignment mark MKX and a single alignment mark MKY.

The alignment marks MKX and MKY will be briefly described with reference to FIG. 7. FIG. 7 is a plan view of a single alignment mark MKX and a single alignment mark MKY.

As shown in FIG. 7, the alignment marks MKX and MKY are areas surrounded by the alignment mark pillars KP. In other words, the alignment marks MKX and MKY are areas where no alignment mark pillars KP are arranged. Furthermore, since the alignment marks are obtained by cross-point forming, the materials that exist in the X direction and the Y direction of the alignment marks are different (ONON/SiO$_2$). A recessed groove is formed on the ONON side of the alignment marks.

In the alignment mark MKX, a length dX1 in the X direction is longer than a length dY1 in the Y direction. In the alignment mark MKY, the X-direction length dX2 is shorter than the Y-direction length dY2.

In other words, the alignment mark MKX provides a second area in a rectangular shape, having a first width dX1 in the X direction wider than the first interval dKX and a second width dY1 in the Y direction wider than the second interval dKY. This second area is surrounded by the first area and includes no alignment mark pillars KP.

The alignment mark MKY provides a third area in a rectangular shape, having a first width dX2 in the X direction wider than the first interval dKX and a second width dY2 in the Y direction wider than the second interval dKY. This third area is surrounded by the first area and includes no alignment mark pillars KP.

Next, the configuration of the alignment mark pillars is described with reference to FIGS. 8 and 9.

FIG. 8 is a plan view of the area "B" shown in FIG. 7 and within an X-Y plane parallel to word lines WLa0 and WLb0. FIG. 9 is a cross-sectional view of an alignment mark, taken along line C1-C2 shown in FIG. 8. Since the basic configuration is the same as that of the memory cell array 11, only the differences will be described.

As shown in FIGS. 8 and 9, the alignment mark pillars LKP are formed in the area corresponding to the area where the memory pillars LMP are formed in the memory cell array 11.

While the memory pillar LMP is in a cylindrical shape, the alignment mark pillar LKP is in the shape of square pole. The cross section of the alignment mark pillar LKP in the X-Y plane is a square having two sides in the X direction and two sides in the Y direction. The alignment mark pillar LKP is filled only with an insulating layer 70, whereas the memory pillar LMP has the block insulating film 54, the charge storage layer 53, the tunnel insulating film 52, the semiconductor layer 51, and the core layer 50. For the insulating layer 70, $SiO_2$ is used, for example.

On the alignment mark pillar LKP, eight layers of the inter-layer insulating film 43 and eight layers of the interconnect layer 44 are alternately stacked in the Z direction. The stack of the eight layers of the inter-layer insulating film 43 and the eight layers of the interconnect layer 44 provided on the alignment mark pillar LKP is labeled as "alignment mark pillar UKP". The alignment mark pillars and LKP and UKP are collectively labeled as "alignment mark pillar KP".

As shown in FIG. 9, the alignment mark pillar UKP projects in the Z direction toward the area where no alignment mark pillars LKP are provided, based on the alignment mark pillar LKP. For this reason, a user who manufactures the semiconductor device 1 is able to recognize the alignment mark pillar UKP.

As will be described later, the area where the memory trench LMT is formed is etched by recessing; thus, a groove is formed in the insulating layer 47 along the memory trench LMT.

In the present embodiment, the sides of the alignment mark in the X direction are defined by the sides of the alignment mark pillar KP in the X direction. The sides of the alignment marks in the Y direction are defined by the sides of the memory trench LMT and the alignment mark pillar KP in the Y direction.

<1-2> Manufacturing Method

Figure 10:
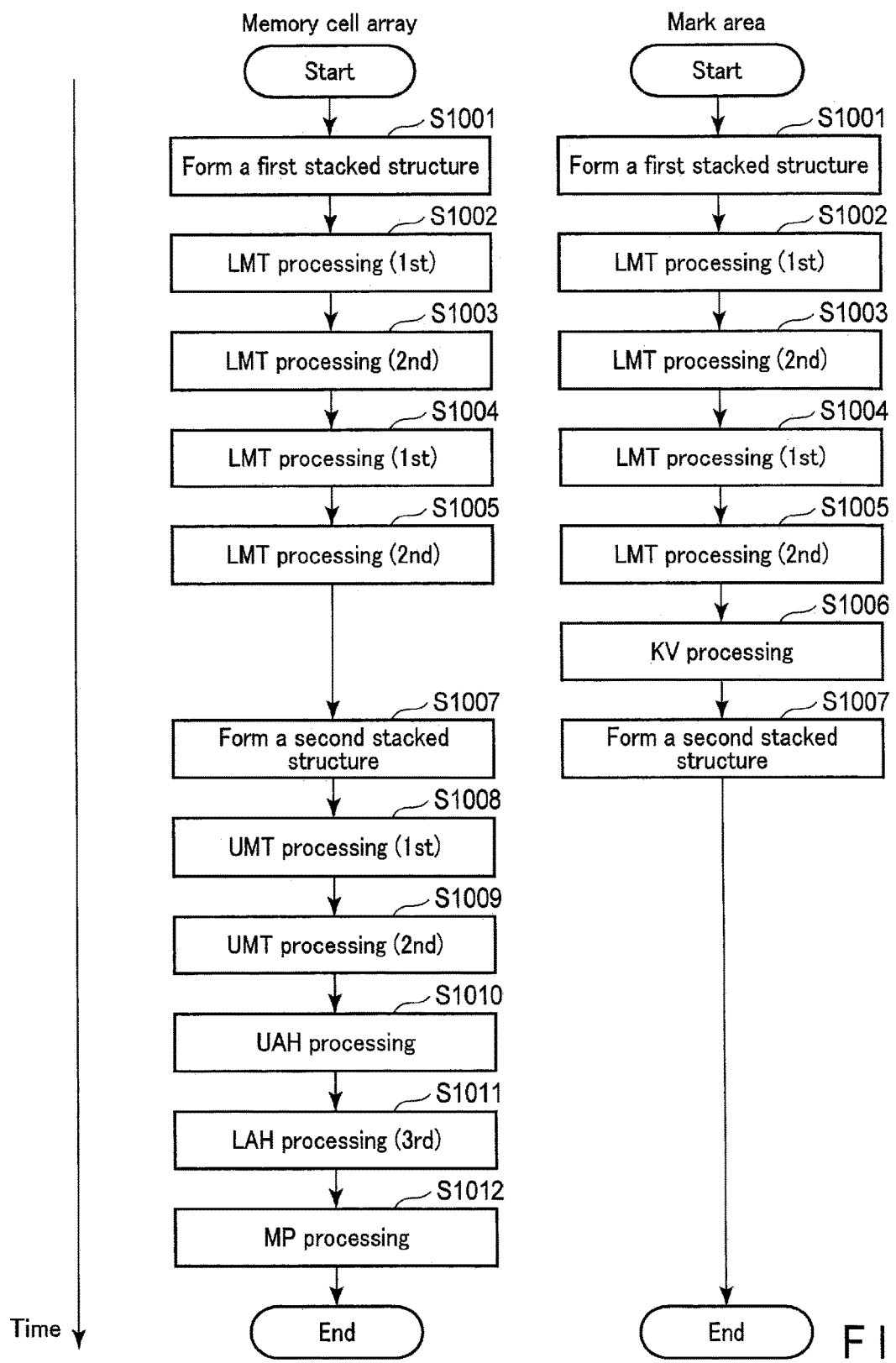
FIG. 10 is a flowchart showing manufacturing steps.

Next, the manufacturing method of the semiconductor device 1 will be described with reference to FIG. 10. FIG. 10 is a flowchart showing manufacturing steps.

The descriptions hereinafter will be made with reference to the flowchart of FIG. 10.

[S1001]

Figure 11:
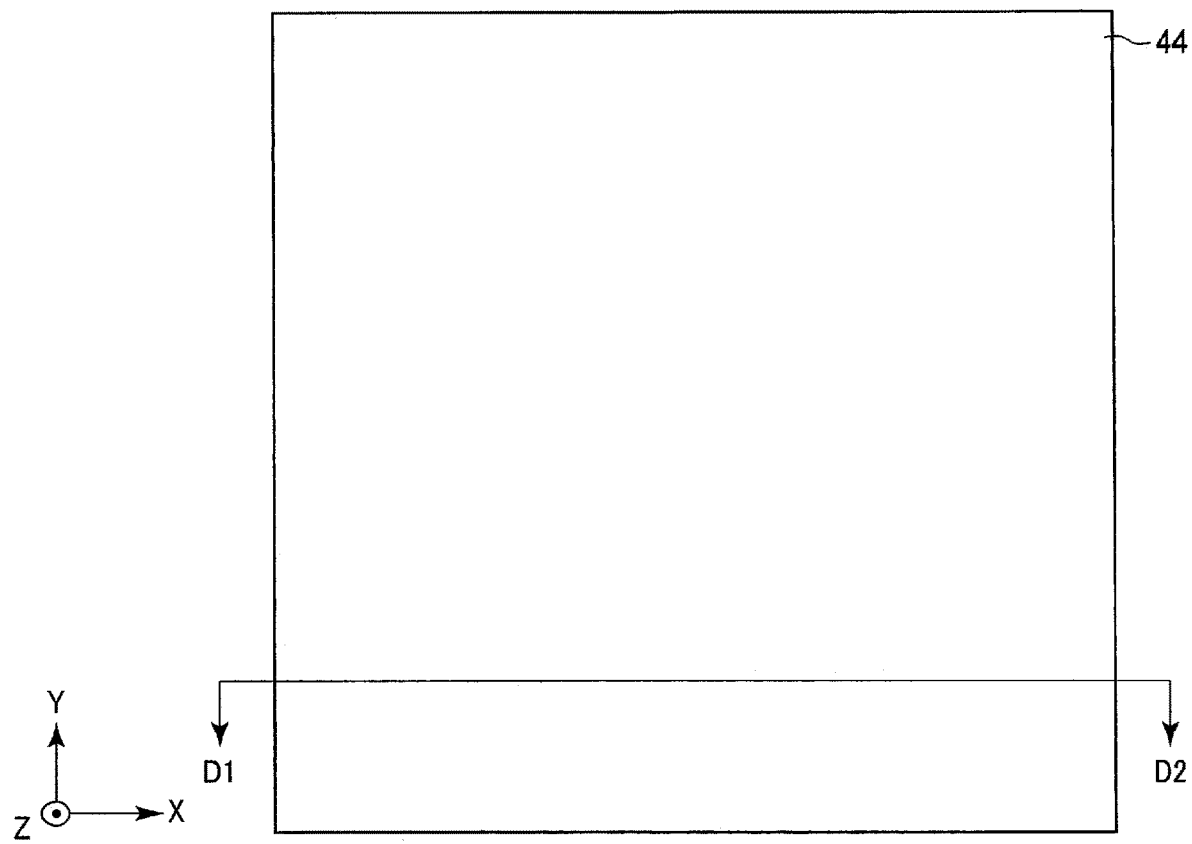
FIG. 11 is a top view of the memory cell array 11 and the mark area 30 in a manufacturing step.

Step S1001 is explained with reference to FIGS. 11 and 12. FIG. 11 is a top view of the memory cell array 11 and the mark area 30 in a manufacturing step, and FIG. 12 is a cross-sectional view of the memory cell array 11 and the mark area 30, taken along line D1-D2 shown in FIG. 11.

Figure 12:
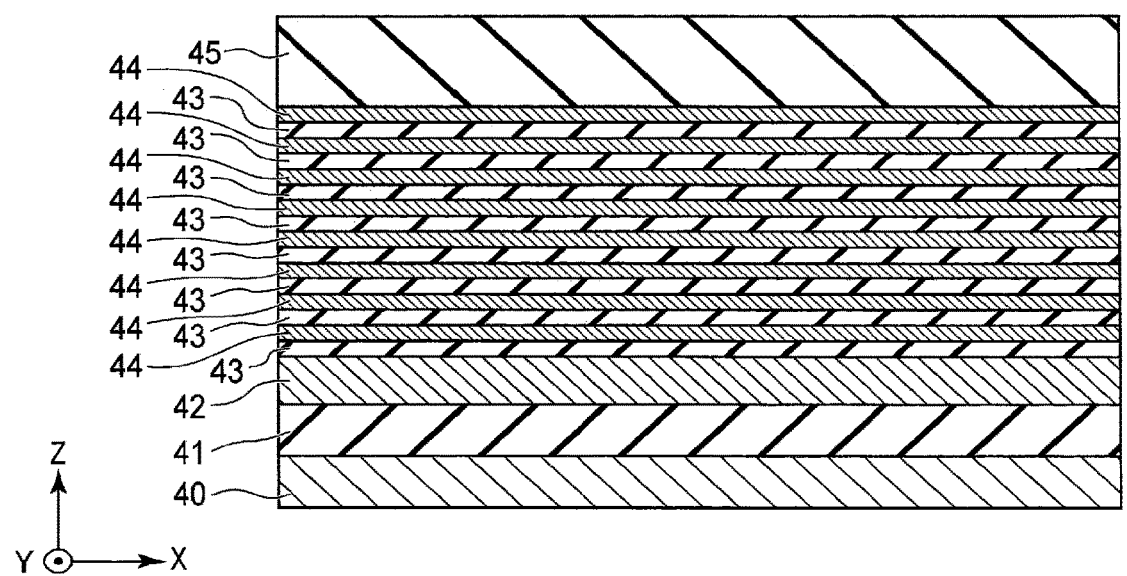
FIG. 12 is a cross-sectional view of the memory cell array 11 and the mark area 30, taken along line D1-D2 shown in FIG. 11.

As shown in FIGS. 11 and 12, as a first stacked structure, the inter-layer insulating film 41 and the interconnect layer 42 are stacked on the interconnect layer 40, and subsequently, eight layers of the inter-layer insulating film 43 and eight layers of the interconnect layer 44 are stacked alternately on the interconnect layer 42 in the Z direction.

[S1002]

Step S1002 is explained with reference to FIGS. 13 and 14. FIG. 13 is a top view of the memory cell array 11 and the mark area 30 in a manufacturing step, and FIG. 14 is a cross-sectional view of the memory cell array 11 and the mark area 30, taken along line D1-D2 shown in FIG. 13.

As shown in FIGS. 13 and 14, line-and-space grooves, which constitute the memory trenches LMT, are formed in the first stacked structure by anisotropic etching, such as RIE (reactive ion etching). The interconnect layers functioning as word lines are thereby divided with respect to the X direction.

[S1003]

Step S1003 is explained with reference to FIGS. 15 and 16. FIG. 15 is a top view of the memory cell array 11 and the mark area 30 in a manufacturing step, and FIG. 16 is a cross-sectional view of the memory cell array 11 and the mark area 30, taken along line D1-D2 shown in FIG. 15.

As shown in FIGS. 15 and 16, an insulating layer (e.g., $SiO_2$) 80 is filled into the groove formed in step S1002 by CVD (chemical vapor deposition), for example.

[S1004]

Figure 19:
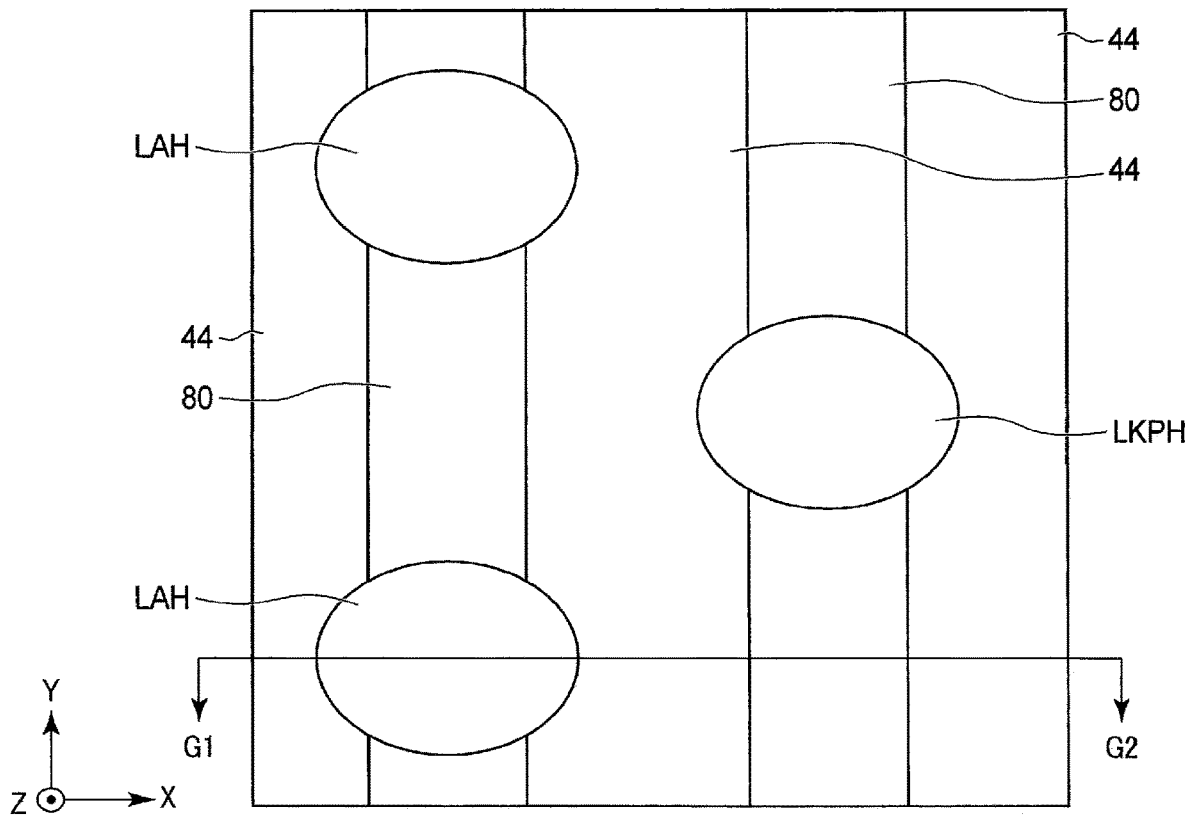
FIG. 19 is a top view of the memory cell array 11 in a manufacturing step.

Step S1004 is explained with reference to FIGS. 17 to 20. FIG. 17 is a top view of the mark area 30 in a manufacturing step, and FIG. 18 is a cross-sectional view of the mark area 30, taken along line E1-E2 shown in FIG. 17. FIG. 19 is a top view of the memory cell array 11 in a manufacturing step, and FIG. 20 is a cross-sectional view of the memory cell array 11, taken along line G1-G2 shown in FIG. 19.

As shown in FIGS. 17 and 18, a hole LKPH, which will later become an alignment mark LKP, is formed by anisotropic etching, for example RIE.

Figure 20:
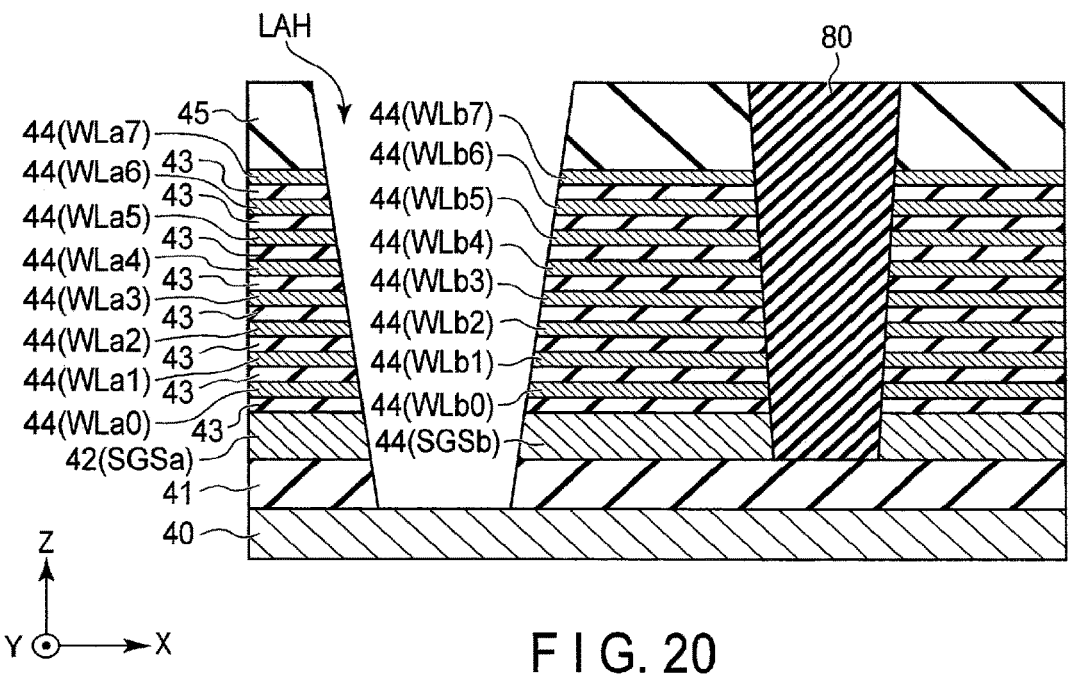
FIG. 20 is a cross-sectional view of a memory cell array 11, taken along line G1-G2 shown in FIG. 19.

As shown in FIGS. 19 and 20, a hole LAH is later formed by anisotropic etching, for example RIE.

[S1005]

Figure 21:
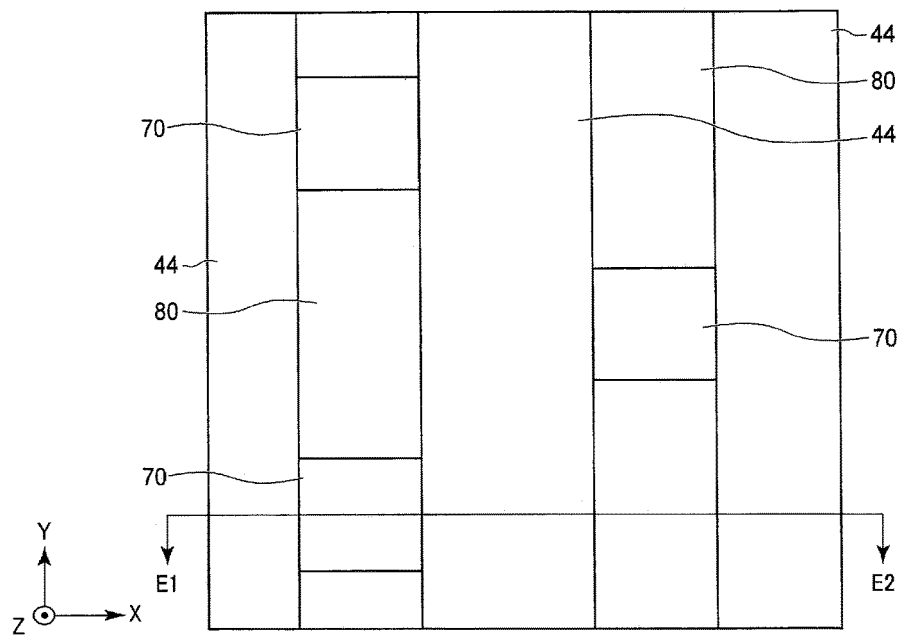
FIG. 21 is a top view of the mark area 30 in a manufacturing step.
Figure 22:
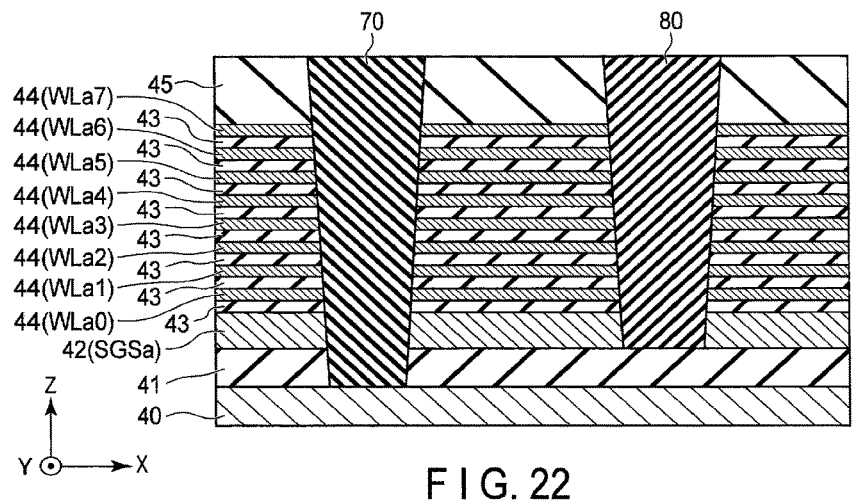
FIG. 22 is a cross-sectional view of the mark area 30, taken along line E1-E2 shown in FIG. 21.

Step S1005 is explained with reference to FIGS. 21 to 24. FIG. 21 is a top view of the mark area 30 in a manufacturing step, and FIG. 22 is a cross-sectional view of the mark area 30, taken along line E1-E2 shown in FIG. 21. FIG. 23 is a top view of the memory cell array 11 in a manufacturing step, and FIG. 24 is a cross-sectional view of the memory cell array 11, taken along line G1-G2 shown in FIG. 23.

As shown in FIGS. 21 and 22, an insulating layer (e.g., $SiO_2$) 70 is filled into the hole LKPH formed in step S1004 by CVD, for example.

As shown in FIGS. 23 and 24, an insulating layer (e.g., $SiO_2$) 90 is filled into the hole LAH formed in step S1004 by CVD, for example.

[S1006]

Step S1006 is explained with reference to FIGS. 25 and 26. FIG. 25 is a top view of the mark area 30 in a manufacturing step, and FIG. 26 is a cross-sectional view of the mark area 30, taken along line E1-E2 shown in FIG. 25.

As shown in FIGS. 25 and 26, the upper portion of the insulating layer 70, which constitutes the alignment mark LKP, is made to project with respect to the interconnect layer 44 by anisotropic etching, such as RIE, etc. (see "F" in the drawing). As shown in FIG. 25, the alignment mark is constituted by making the upper portion of the insulating layer 70, which constitutes the alignment mark pillars LKP, projected. Such processing may be referred to as "KV processing" hereinafter.

[S1007]

Step S1007 is explained with reference to FIGS. 8, 9, 27, and 28. FIG. 27 is a top view of the memory cell array 11 in a manufacturing step, and FIG. 28 is a cross-sectional view of the memory cell array 11, taken along line G1-G2 shown in FIG. 27.

As shown in FIGS. 8, 9, 27, and 28, on the first stacked structure, as a second stacked structure, eight layers of the inter-layer insulating film 43 and eight layers of the interconnect layer 44 are alternately stacked in the Z direction.

Thus, the alignment mark pillars UKP based on the alignment mark pillars LKP are formed in the mark area 30, as shown in FIGS. 8 and 9. The alignment marks are thereby formed in the mark area 30.

[S1008]

Figure 29:
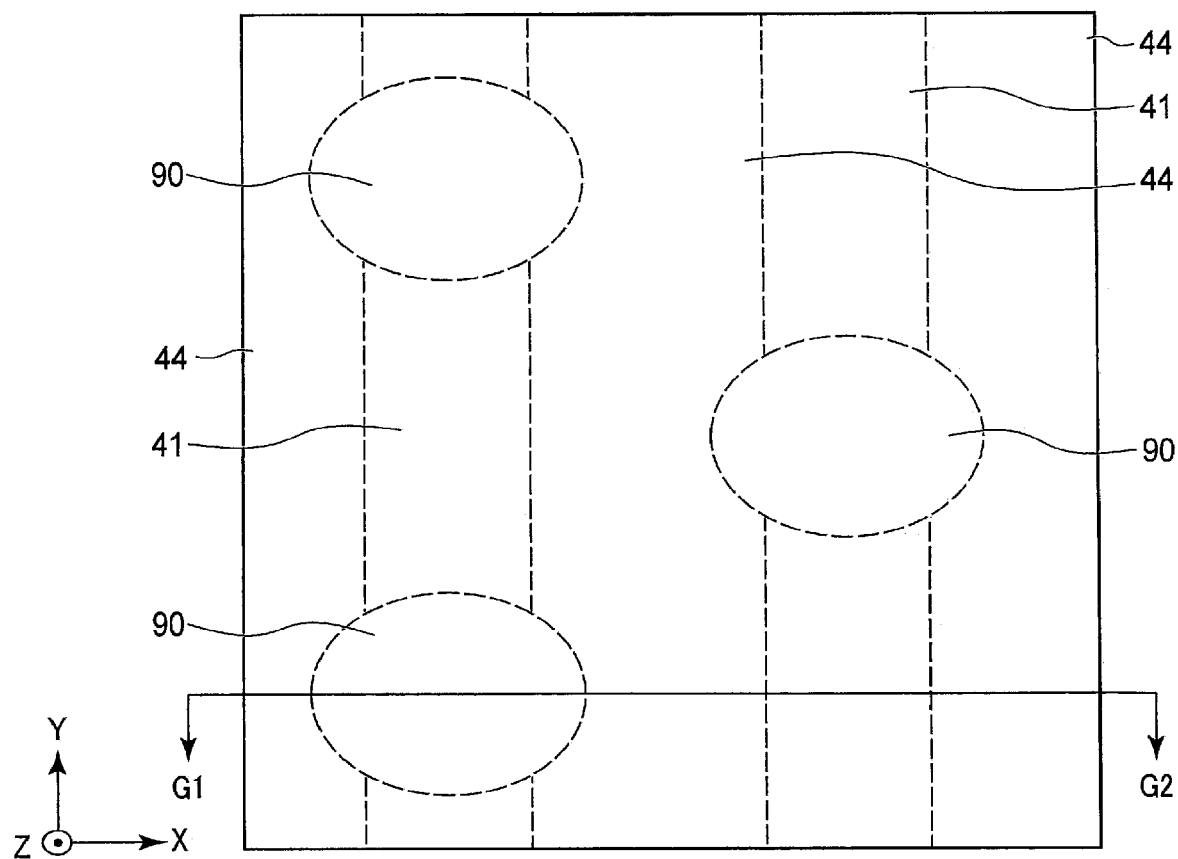
FIG. 29 is a top view of the memory cell array 11 in a manufacturing step.

Step S1008 is explained with reference to FIGS. 29 and 30. FIG. 29 is a top view of the memory cell array 11 in a manufacturing step, and FIG. 30 is a cross-sectional view of the memory cell array 11, taken along line G1-G2 shown in FIG. 29.

As shown in FIGS. 29 and 30, line-and-space grooves, which constitute the memory trenches UMT, are formed in the second stacked structure by anisotropic such as RIE. The interconnect layers functioning as word lines are thereby divided with respect to the X direction.

At this time, alignment is performed using the alignment marks provided in the mark area 30.

[S1009]

Step S1009 is explained with reference to FIGS. 31 and 32. FIG. 31 is a top view of the memory cell array 11 in a manufacturing step, and FIG. 32 is a cross-sectional view of the memory cell array 11, taken along line G1-G2 shown in FIG. 31.

Figure 32:
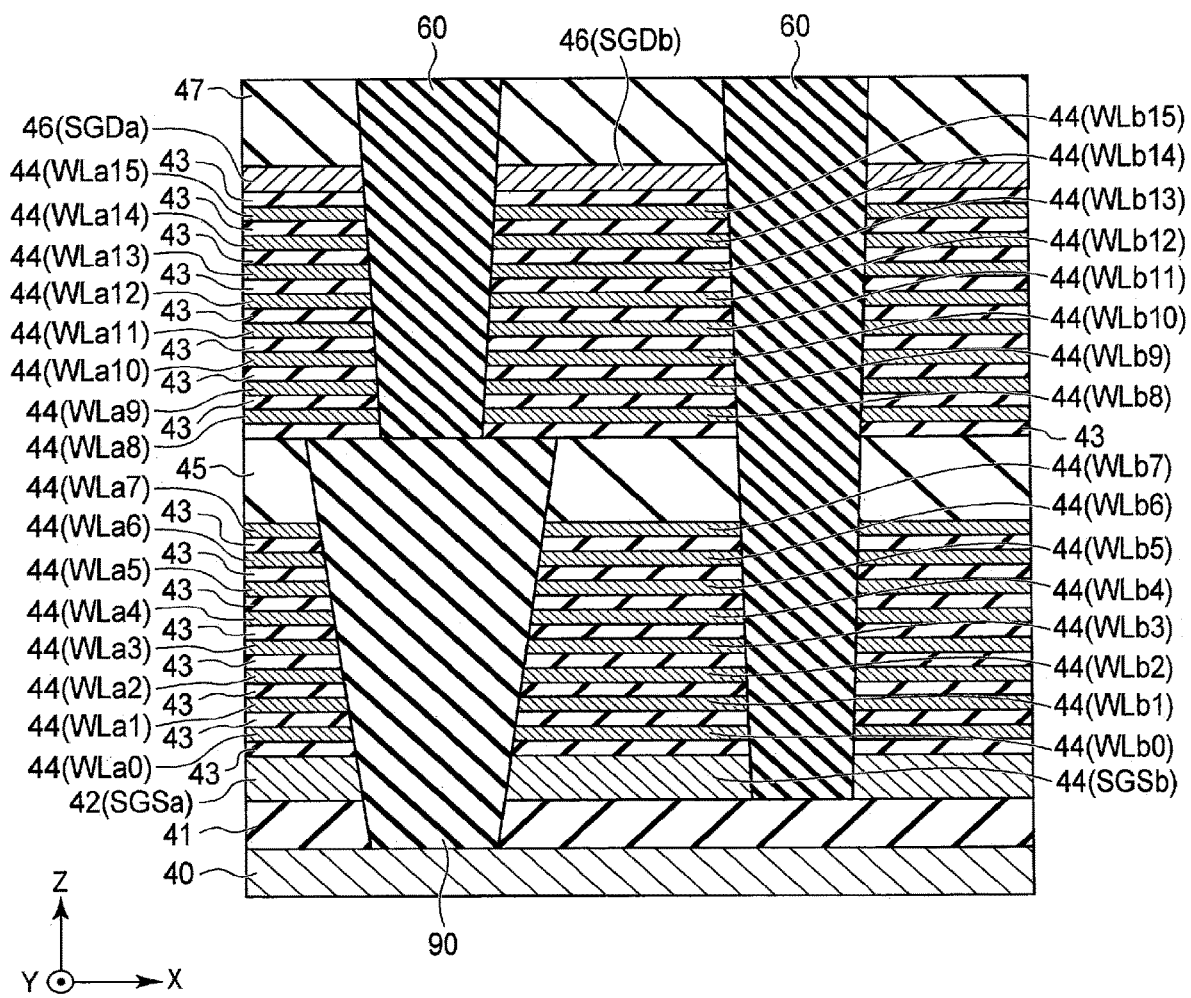
FIG. 32 is a cross-sectional view of the memory cell array 11, taken along line G1-G2 shown in FIG. 31.

As shown in FIGS. 31 and 32, the insulating layer (e.g., SiO$_2$) 60 is filled by CVD, etc. into the groove formed in step S1008.

[S1010]

Figure 33:
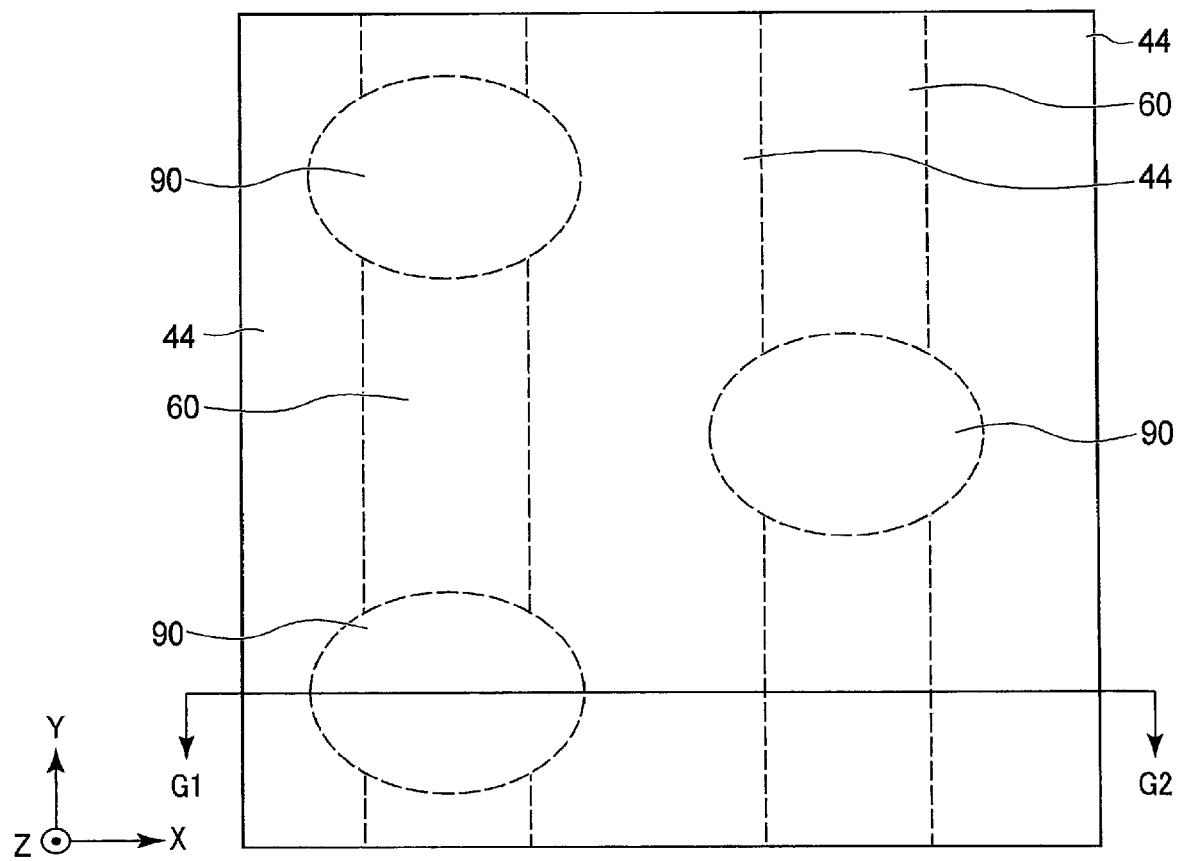
FIG. 33 is a top view of the memory cell array 11 in a manufacturing step.

Step S1010 is explained with reference to FIGS. 33 and 34. FIG. 33 is a top view of the memory cell array 11 in a manufacturing step, and FIG. 34 is a cross-sectional view of the memory cell array 11, taken along line G1-G2 shown in FIG. 33.

As shown in FIGS. 33 and 34, a hole UAH is formed by anisotropic etching, for example RIE.

At this time, alignment is performed using the alignment marks provided in the mark area 30.

[S1011]

Figure 35:
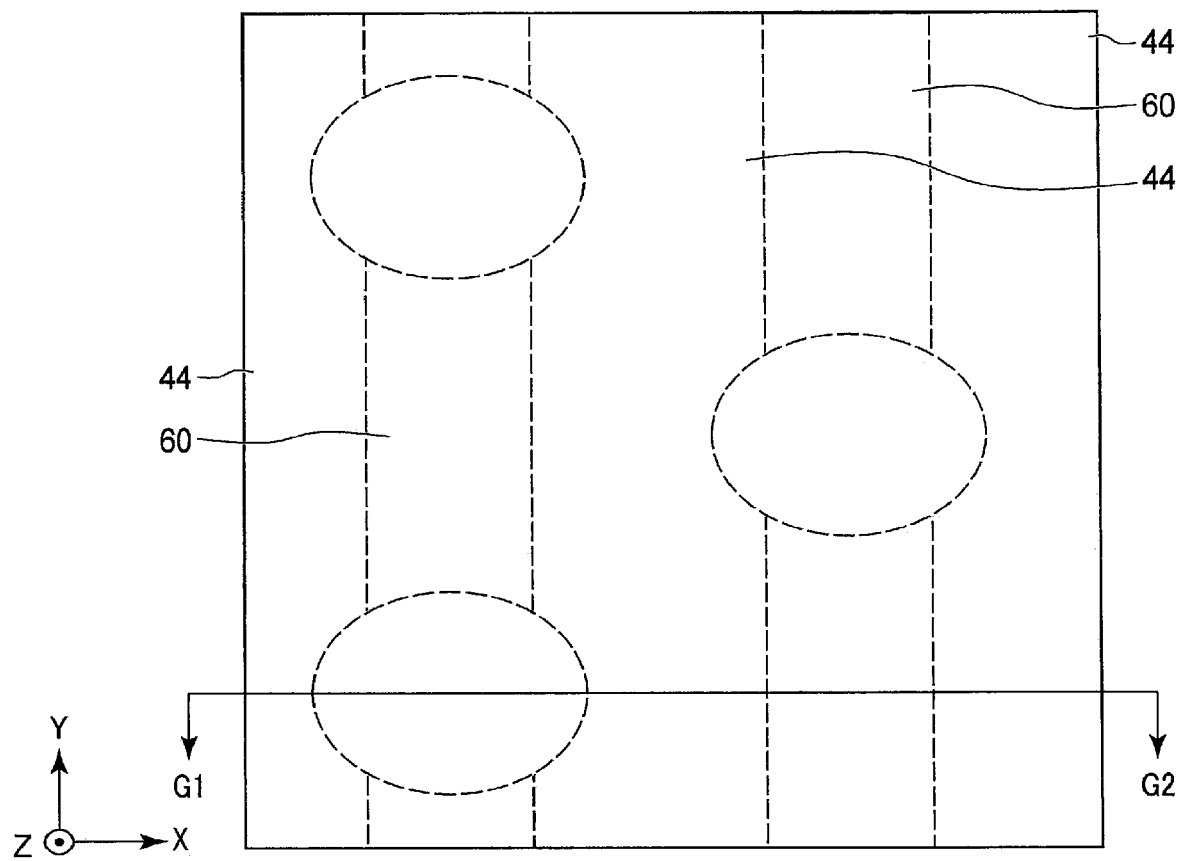
FIG. 35 is a top view of the memory cell array 11 in a manufacturing step.

Step S1011 is explained with reference to FIGS. 35 and 36. FIG. 35 is a top view of the memory cell array 11 in a manufacturing step, and FIG. 36 is a cross-sectional view of the memory cell array 11, taken along line G1-G2 shown in FIG. 35.

As shown in FIGS. 35 and 36, an insulating layer provided in the hole LAH is remove by wet etching, etc.

[S1012]

Step S1012 is explained with reference to FIGS. 3 and 4.

In the inside of the holes LAH and UAH, the block insulating film 54, the charge storage layer 53, the tunnel insulating film 52, the semiconductor layer 51, and the core layer 50, and a memory pillar UMP are formed in this order.

<1-3> Effects

According to the above-described embodiment, the alignment mark pillars LKP are formed with cross-point processing, using the memory trenches LMT. The alignment mark pillars LKP are then made to project so as to be distinguishable from the periphery. When a second stacked structure is formed, the projection of the alignment mark pillar LKP from the periphery causes the alignment marks to appear in the mark area 30.

On the other hand, in the case of a semiconductor device wherein two or more tiers of the memory cell pillars are formed, when the upper tier and the lower tier are directly joined, it will likely be difficult to achieve a simple mark formation if the lower layer pattern is formed by cross-point processing.

However, according to the present example, in the case where the lower layer pattern is formed by cross point processing, the mark area is filled with the memory trenches LMT. At this time, the Y-direction edge of the alignment mark is aligned with the line end of the memory trench LMT. The hole LKPH is formed so as to match the X direction-edge of the alignment mark. The alignment marks are then formed by filling the portions other than the marks with the alignment mark pillars LKP.

In other words, the edge in the Y direction is constituted by the memory trench LMT, and the edge in the X direction is constituted by the hole LKH. For this reason, alignment marks can be easily formed.

<2> Other Modifications, Etc

The manufacturing steps described in the foregoing embodiment are merely an example; any process may be inserted between these steps, and the order of the steps may be changed as appropriate. Any manufacturing steps may be adopted for the steps of manufacturing the semiconductor device 1 as long as the structure described in the foregoing embodiment can be formed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor device comprising:
    a first stacked structure in which first insulating layers and first conductive layers are alternately stacked in a first direction;
    a second stacked structure in which second insulating layers and second conductive layers are alternately stacked in the first direction;
    a first memory pillar provided in the first stacked structure;
    a first dividing structure extending in a second direction orthogonal to the first direction and dividing the first conductive layers in a third direction orthogonal to the first and second directions;
    a second memory pillar provided within the second stacked structure and connected to the first memory pillar, the second stacked structure being provided via a third insulating layer arranged on the first stacked structure;
    a second dividing structure extending in the second direction and dividing the second conductive layers in the third direction;
    a first alignment mark pillar provided in the first stacked structure and projecting from the first stacked structure in the first direction;
    a second alignment mark pillar provided on the first alignment mark pillar, and constituted by a projection of the second stacked structure in the first direction; and
    an alignment mark surrounded by the second alignment mark pillar.

2. The semiconductor device according to claim 1, wherein
the first alignment mark pillar is arranged within the first dividing structure.

3. The semiconductor device according to claim 1, wherein
the first dividing structure is provided and the second alignment mark pillar is not provided in the alignment mark.

4. The semiconductor device according to claim 1, wherein
in the alignment mark, an edge in the second direction is defined by an edge of the first alignment mark pillar, and an edge in the third direction is defined by an edge of the first dividing structure.

5. The semiconductor device according to claim 1 further comprising:
a memory area in which the first memory pillar and the second memory pillar are provided; and
a mark area in which the first alignment mark pillar, the second alignment mark pillar, and the alignment mark are provided, wherein
in the memory area, the second stacked structure is provided on the third insulating layer, and
in the mark area, the second stacked structure is provided on the first insulating layer.

6. The semiconductor device according to claim 5, wherein
the second dividing structure is provided in the memory area but not in the mark area.

7. The semiconductor device according to claim 1 further comprising:
a third conductive layer; and
a fourth insulating layer provided between the first stacked structure and the third conductive layer, wherein
an end of the first memory pillar is in contact with the third conductive layer.

8. The semiconductor device according to claim 7, wherein
an end of the first alignment mark pillar is in contact with the third conductive layer.

9. The semiconductor device according to claim 1, wherein
a first main surface of the first alignment mark pillar facing the second direction is in contact with the first dividing structure, and
a second main surface of the first alignment mark pillar facing the third direction is in contact with the first stacked structure.

10. The semiconductor device according to claim 1, wherein
the alignment mark includes a first alignment mark in which a first width in the second direction is narrower than a second width in the third direction, and a second alignment mark in which the first width is wider than the second width.

11. The semiconductor device according to claim 1, wherein
the first alignment mark pillar includes a fifth insulating layer, and
the first dividing structure includes a sixth insulating layer.

12. The semiconductor device according to claim 1, wherein
each of the first and second memory pillars includes a charge storage layer.

13. A semiconductor device, comprising:
a first stacked structure in which first insulating layers and first conductive layers are alternately stacked in a first direction; and
a second stacked structure provided on the first stacked structure and in which second insulating layers and second conductive layers are alternately stacked in the first direction, wherein
the first stacked structure includes:
a first area in which first alignment mark pillars extending in the first direction are arranged in a two-dimensional lattice, through being provided at first intervals along a second direction intersecting with the first direction, and at second intervals along a third direction orthogonal to the first direction and the second direction; and
a second area in a rectangular shape surrounded by the first area, having a first width in the second direction wider than the first interval, and a second width in a third direction wider than the second interval, and including no first alignment mark pillars.

14. The semiconductor device according to claim 13, wherein
the second area includes a first alignment mark in which the first width is narrower than the second width, and a second alignment mark in which the first width is wider than the second width.

15. The semiconductor device according to claim 13, wherein
the first stacked structure includes a first dividing structure that extends in the second direction and divides the first conductive layers in the third direction.

16. The semiconductor device according to claim 15, wherein
the first alignment mark pillars are arranged within the first dividing structure.

17. The semiconductor device according to claim 15, wherein
in the second area, an edge in the second direction is defined by an edge of at least one of the first alignment mark pillars, and an edge in the third direction is defined by an edge of the first dividing structure.

18. The semiconductor device according to claim 15, wherein
first main surfaces of the first alignment mark pillars facing the second direction are in contact with the first dividing structure, and
second main surfaces of the first alignment mark pillars facing the third direction are in contact with the first stacked structure.

19. The semiconductor device according to claim 13, further comprising:
a third conductive layer; and
a fourth insulating layer provided between the first stacked structure and the third conductive layer, wherein
ends of the first alignment mark pillars are in contact with the third conductive layer.

* * * * *